US006969287B1

(12) United States Patent
Motsenbocker

(10) Patent No.: US 6,969,287 B1
(45) Date of Patent: Nov. 29, 2005

(54) ELECTRONIC SHUT OFF SYSTEMS

(76) Inventor: Marvin A. Motsenbocker, 17 Wallace Farms La., Fredericksburg, VA (US) 22406

( * ) Notice: Subject to any disclaimer, the term of this patent is extended or adjusted under 35 U.S.C. 154(b) by 107 days.

(21) Appl. No.: 10/754,608

(22) Filed: Jan. 12, 2004

Related U.S. Application Data

(63) Continuation of application No. 10/724,240, filed on Dec. 1, 2003, which is a continuation-in-part of application No. 10/187,830, filed on Jul. 3, 2002, now Pat. No. 6,676,460, and a continuation-in-part of application No. 10/620,618, filed on Jul. 17, 2003, now abandoned.

(60) Provisional application No. 60/323,723, filed on Sep. 21, 2001, provisional application No. 60/302,647, filed on Jul. 5, 2001, provisional application No. 60/349,375, filed on Dec. 22, 2001, provisional application No. 60/431,200, filed on Dec. 6, 2002, provisional application No. 60/433,591, filed on Dec. 16, 2002, provisional application No. 60/445,249, filed on Feb. 6, 2003, provisional application No. 60/474,957, filed on Jun. 3, 2003.

(51) Int. Cl.[7] ............................................. B63H 21/22
(52) U.S. Cl. ............................................. 440/1; 440/71
(58) Field of Search .............................. 440/65, 71, 74, 440/83, 1

(56) References Cited

U.S. PATENT DOCUMENTS

| 1,448,225 | A |   | 2/1923 | Thompson |
| 2,436,939 | A |   | 3/1948 | Schug |
| 2,737,145 | A |   | 3/1956 | Gentile |
| 2,888,149 | A |   | 5/1959 | Baermann |
| 3,310,693 | A |   | 3/1967 | Aronoff |
| 3,438,328 | A |   | 4/1969 | Laing |
| 3,848,976 | A | * | 11/1974 | Tsujimoto et al. ............ 352/17 |
| 4,093,050 | A | * | 6/1978 | Mizuno ...................... 477/195 |
| 4,115,040 | A |   | 9/1978 | Knorr |
| 4,277,707 | A |   | 7/1981 | Silver et al. |
| 4,616,509 | A | * | 10/1986 | Feller ...................... 73/861.05 |
| 4,734,817 | A |   | 3/1988 | Baker |
| 4,754,181 | A |   | 6/1988 | Mizobuchi |
| 5,936,321 | A |   | 8/1999 | Kameoka |
| 6,005,317 | A |   | 12/1999 | Lamb |
| 6,216,501 | B1 |   | 4/2001 | Marquardt et al. |
| 6,676,460 | B1 | * | 1/2004 | Motsenbocker ................ 440/1 |

FOREIGN PATENT DOCUMENTS

JP            06190258 A      7/1994

* cited by examiner

*Primary Examiner*—Stephen Avila

(57) ABSTRACT

Rapid shaft stop devices and transmissions are described that utilize permanent magnets for coupling and/or braking and are useful for electronic propeller guards and other equipment. In an embodiment, one or more capacitive discharge pulses are used to rapidly stop a shaft. A magnetic transmission is provided having axially oriented magnets on each side of an air space junction that transmit torque across the junction with a torque/speed profile that particularly suits boat propellers. The junction may include a bearing and allows slippage when the propeller resistance exceeds a given value. This slippage acts as a variable gear reduction. One or more electromagnets may be energized and thereby add to or subtract from one or more magnetic fields and provide electronic control of torque and of gear reduction ratio for devices such as watercraft drive systems.

31 Claims, 17 Drawing Sheets

13b

13a

13c

ELECTRONIC SHUT OFF SYSTEMS

REFERENCE TO RELATED APPLICATIONS

This application is a continuation in part of U.S. Ser. No. 10/187,830 filed Jul. 3, 2002, now U.S. Pat. No. 6,676,460 and a continuation of U.S. Ser. No. 10/724,240 filed Dec. 1, 2003, which in turn enjoy priority from U.S. provisional application Nos. 60/323,723 filed Sep. 21, 2001, 60/302,647 filed Jul. 5, 2001, 60/349,375 filed Dec. 22, 2001, 60/431,200 filed Dec. 6, 2002, and 60/433,591 filed Dec. 16, 2002, and also enjoys priority from U.S. Nos. 60/445,249 filed Feb. 6, 2003, 60/474,957 filed Jun. 3, 2003 and is a CIP of Ser. No. 10/620,618 filed Jul. 17, 2003 now abandoned the contents of which are incorporated by reference in their entireties.

FIELD OF THE INVENTION

The invention relates to machinery and rapid stopping of motor driven machinery such as electric saws, meat cutters, robots, and motor driven propellers in response to sensed conditions.

BACKGROUND OF THE INVENTION

Energy efficiency is a major concern that affects nearly every aspect of society. Industrial machinery and transportation in particular are heavy consumers of portable energy through the use of electricity, gasoline, diesel or natural gas powered motors. Most energy from a transportation energy source dissipates as heat because of inefficiencies during chemical energy conversion into mechanical work. A major inefficiency is the mismatch between a faster rotating motor shaft or gear and a slower rotating device that receives such energy such as a wheel of a car or propeller of a boat.

A variety of transmission systems have been developed to minimize these losses. Unfortunately, each system has its own inefficiencies and problems. For example, in the case of powered watercraft that employ a fixed gear ratio, energy is lost from friction in the reducing gear and also in the propeller of such drive systems because the small propellers used represent a compromise and rotate at a much higher than ideal rate to push water efficiently. Ideally, a fast rotating motor with a high power output and with shaft speed of about 3,000 or 4,000 rpm should be geared down to a much slower rpm of a few hundred rpm, but with higher torque as needed to push water with a (preferably) large, slowly revolving propeller. Inexpensive gears and transmissions generally are not available for such high ratio speed changes. Accordingly, modern pleasure watercraft at low to medium speed generally are operated at lower than desired efficiencies.

David Geer has described this low efficiency problem of moderate speed watercraft (Propeller Handbook page 79) as "[f]or a given horsepower, the slower the shaft RPM and the larger the diameter the more efficient the propeller will be. This is true for every installation, unless the boat speed will consistently be above 30 or 35 knots. Accordingly, in selecting a propeller you should always start with the largest diameter possible for the given hull, and work from there. . . . Draft limitations, hull shape, and tip clearances . . . are nearly the only factors that should cause you to consider a smaller diameter for slow-to-moderate speed craft. Another practical limitation is that while reduction gears with ratios as great as 6 or 7 to 1 are available for larger marine engines of, say over 250 hp (185 kw). standard reduction gears . . . are seldom available with ratios larger than 3 to 1 . . . . " According to this reasoning, a highly efficient and simple gear reduction of greater ratios approaching 10 or even 20 fold would give great benefits for many watercraft but is not readily available for regular watercraft.

A related problem is the need to rapidly stop a propeller, conveyor or other equipment upon detection of an unsafe condition. For example, a spinning propeller poses great hazards to swimmers and other waterlife. A rapid propeller stop system, is highly desirable but generally not considered because of the extreme difficulty in rapidly stopping a propeller. A limitation in this regard is that most propeller shafts are permanently fixed to a motor, either directly or indirectly through reduction gearing and rapid stoppage would overstress the drive system, due to the inertia of moving parts. Although not generally appreciated, a power transmission link between motor and propeller that both provides a high rotational speed change and the ability to rapidly stop a connected propeller would potentiate technological advances in electronic propeller guard systems. Unfortunately, such system generally is not available.

Such systems, if available could save lives. According to statistics kept by the U.S. Coast Guard, scores of people are killed or severely maimed each year from propeller injuries. Other mammals such as manatees are severely injured and disfigured and this problem threatens the tourism industry in areas such as Homosassa Springs State Park in Florida. The boating industry has struggled with this problem without much success for some time. The often proposed solution of using a mechanical propeller guard to physically block contact, while logical at first glance actually is very impractical, despite a number of attempts to implement this idea as described in U.S. Pat. Nos. 3,889,624; 4,411,631; 44,826,461; 4,078,516; 5,238,432; 4,957,4459; 5,009,620; 4,304,558; 5,759,075; 4,565,533; and 4,106,425. The guard would rob too much propulsion power and in some cases could increase the occurrence and severity of propeller injuries because the guard can act as a catch that prevents easy removal of a hand or foot from the propeller vicinity as commented on, for example by the Superior Court of Pennsylvania (Fitzpatric v. Madonna, 623 Aa.2d 322 1993), which stated that "the presence of a shroud over the propeller presents its own risks for swimmers. For example, a shroud creates a larger target area. In addition, the possibility exists that human limbs may become wedged between a shroud and the propeller, exposing a swimmer to even greater injury." Accordingly, a safer system is desired that can rapidly stop a propeller.

A large variety of gear reducers, clutches and other power transmission devices have been developed for many transportation machines. New types of clutches have evolved particularly for fans and air conditioners on cars and trucks and have provided incremental but highly desirable efficiency improvements for some applications. For example, a series of patents from Larry Link describe an electric clutch that electromagnetically disengages a fan as needed to minimize drag on an engine when the cooling fan is not required. See, for example, U.S. Pat. Nos. 6,129,193; 6,230,866; 6,331,743 and 5,947,248; which teach the use of radially disposed electromagnets and a concentric set of pole pieces separated by an air gap. The torque transfer is modulated by controlling electric power to the multiple radially disposed electromagnets. This system promises to overcome frictional losses engendered by the widely used viscous clutch systems. However, the Link device appears to generate a considerable amount of heat, the electromagnets generally are rotating and need an electrical supply through a slip ring, and the entire system requires numerous parts. Furthermore, the energy efficiency of the Link system, which is notable by its omission from the copious documents that describe this technology, apparently is low. This view is supported by the Link disclosures, which emphasize multiple features that generally had to be added to remove heat buildup from the frictional losses, which again indicate that the system is inefficient.

Magnetic systems have been described for coupling other rotating axles as well. Masberg et al. (U.S. Pat. No. 6,149,544) teaches a coaxial (rotating cylinder within a rotating cylinder) dual electromagnet system that offers a stator body and a housing, which in some embodiments resembles a motor that couples two axles as a magnetically controlled clutch. This system is complex and generally requires a three dimensional magnetic assembly that maintains close tolerances in a dimension along the axis of rotation. Magnetic fields interact that are perpendicular to the rotational axis. The device is not unlike that of a regular induction motor, with the armature connected to a first axle and the field coil rotating and connected to a second axle.

Another interesting coaxial electromagnetic coupler is taught by U.S. Pat. No. 5,565,723, which emphasizes an internal electrical feedback to obtain a desired torque speed characteristic. The apparatus taught in this patent also uses two coaxially oriented rotable parts with inner and outer cylinders of electromagnets that exert magnetic coupling forces, which are perpendicular to the axis of rotation. This system as well appears very complex, and has slip rings to apply electricity to moving electromagnets. Such complexity is undesirable, particularly for applications in the marine environment, where exposed electrical connections and conductors need to be marinized.

Despite a wealth of technology in the automotive and related arts, transmissions that provide high gear ratios and inexpensive, durable rapid acting clutches are not widely used for regular pleasure watercraft and other applications such as screw conveyors, elevators and related devices. In the case of watercraft, durable and cost competitive gear reducers of gear ratios less than 4 to 1 generally are used and rapid disconnect of propellers from the drive train is not carried out because of technology and cost limitations. While not recognized as such, these limitations are taken for granted and specific watercraft installations are optimized with inherent built in equipment limitations. For example, a specific boat with a specific boat motor generally is matched with a specific propeller that meets a selected criteria for best torque, motor speed, and motor output for a single optimum boat speed. Consequently, most drive systems are limited to a single gear reduction ratio and a single optimum propeller/boat combination that is chosen partly based on such a specific combination.

Similar limitations exist for other applications such as saws, conveyors and vehicles. Any device that provides greater flexibility in torque conversion between an upstream driving axle, such as a crankshaft or other drive gear and a downstream axle, such as a propeller shaft or other gear would advance the art of mechanical energy conversion by allowing a broader range of conditions for optimization. In the example of a torque converter for a propeller driven watercraft, better optimization of boat speed for optimum efficiency, and motor or motor conditions would be possible if a suitable torque converter were available that was efficient over a wide range.

SUMMARY OF THE INVENTION

Embodiments provide systems that can, for example, quickly stop a propeller or other device before the device can significantly damage an object that appears nearby. In embodiments an electronic sensor detects a solid object that enters a danger zone near the propeller or other device and triggers a circuit that rapidly stops the device. In other embodiments a device records, monitors and reports in real time instances of sensing imminent contact with a solid object.

Another embodiment provides a system to limit contact of a propeller having a diameter D with a solid object in a motor driven watercraft comprising at least one sensor that monitors a danger zone, the zone comprising a circular area of diameter D located distance D immediately ahead of the propeller perpendicular to the direction of motion and outputs a signal in response to intrusion of a solid object in the danger zone; and an activator electric control circuit that stops motor movement upon receipt of the signal.

Another embodiment provides a watercraft that contains a system for limiting propeller contact with a solid object in the water, comprising at least two monitor sensors attached to one or more control surfaces in the water and upstream of the propeller that output an electrical response upon detection of the solid object; and an electric control circuit that accepts the signal and stops motor movement upon the detection of the solid object.

Yet another embodiment provides an electrical control device for suddenly stopping a propeller in a motor driven watercraft, comprising a sensor that detects a-solid object near the propeller and a control circuit that can stop or slow the propeller to less than 10 rpm within one second, wherein the sensor triggers the control circuit upon sensing the solid object.

Further embodiments provide gear reductions and torque conversions for a variety of equipment such as watercraft, other vehicles, screw drives, conveyor movements, and elevators, and directly thereby alleviate the problems noted above. Improved fuel efficiency, improved speed performance and improved flexibility for using effectors such as propellers, screws and gears are made possible by embodiments. Embodiments also provide the ability to rapidly stop a machine or effecter such as a propeller and potentiate the use of electronic propeller guard systems. Other embodiments provide motor starters, generators and regeneration in combination with power sources such as internal combustion engines.

One advantageous embodiment is an axial connector or magnetic torque converter comprising a first rotating shaft with a flanged end that contains one or more magnetic field responsive materials (e.g. a paramagnetic substance, ferromagnetic substance, or magnet); a second rotating shaft with a flanged end that contains one or more magnets; and a bearing between the first shaft flanged end and the second shaft flanged end that allows independent rotation of the first and second flanged ends along a common axis; wherein magnetic field(s) from one flanged end to the other exerts a tugging force that transmits rotating force from the first rotating shaft to the second rotating shaft and optionally holds the two flanged ends together. Another embodiment is a self aligning axial connector or torque converter that transmits rotational force between two shafts, comprising a first coupler that connects to a first rotating shaft and that comprises one or more magnets or magnetic field responsive material; a second coupler that connects to a second rotating shaft and that comprises one or more magnets; and a bearing between the first coupler and the second coupler, wherein the magnetic field(s) across the first and second couplers optionally holds the two couplers together and the magnetic field(s) orient such that maximum magnetic attraction occurs when the couplers are located at the center of their rotating axes.

In another embodiment a magnetic torque converter with flanged ends as described here further comprises one or more electromagnets that exert a force that affects the coupling force, (magnetic force between the flanges) and thereby controls the transmission of force from the upstream spinning axle to the downstream spinning axle. In an embodiment at least one electromagnet coil surrounds at least one spinning magnetically response axle and imparts a magnetic field to the axle and to connected parts, such as a flange, thereby modulating the torque transfer. In yet another embodiment one or more non-rotating surfaces in magnetic contact (i.e. close enough to exert a magnetic force) to one or more flanges form an electromagnet and influences the torque transfer this way. In yet another embodiment at least the downstream axle (axle that receives rotational force through the magnetically coupled device from the upstream axle) or upstream axle has one or more magnet(s) attached that are influenced by application of magnetic field from a fixed electromagnet outside the axle and that forms a braking mechanism wherein activation of the fixed electromagnet exerts a force on the spinning axle/permanent magnet, thereby slowing the spin.

Yet another embodiment is a torque converter or axial connector that acts as a starter motor for a connected internal combustion engine, comprising a torque converter or axial connector as described herein and a high current starter circuit electrically connected to one or more electromagnets, wherein the starter circuit activates the magnetic field of the one or more electromagnets to turn the internal combustion engine. Yet another embodiment is a torque converter or axial connector that acts as a power generator, comprising a torque converter or axial connector as described herein and a power consuming circuit electrically connected to one or more electromagnets, wherein rotation of one or more magnets within the torque converter or axial connector induces an electrical signal within the one or more electromagnets and the electrical signal is dissipated in the power consuming circuit. Yet another embodiment is a powered watercraft that comprises at least one motor and at least one propeller, the watercraft further comprising a torque converter or axial connector.

Yet another embodiment is a kit for adding a magnetic torque converter or axial connector to a watercraft, comprising a package, a magnetic torque converter or axial connector as described herein within the package, and one or more mechanical parts for installation. Yet another embodiment is a method of commercial research and development of watercraft propulsion systems, comprising providing a torque converter or axial connector as described herein, and connecting at least one rotation axis of the torque converter or axial connector to a motor. Yet another embodiment is a method of improving the performance of a watercraft, comprising providing a torque converter or axial connector as described herein, and connecting at least one rotation axis of the torque converter or axial connector to a motor. Yet another embodiment is a method of increasing the ability of a company in the marine field to obtain investment capital from a prospective source of capital, comprising adding a description of a torque converter or axial connector as described herein to a business plan and providing the business plan to the prospective source of capital.

Yet another embodiment is a system for rapidly stopping a blade, comprising one or more infrared sensors and an electromagnetically energized magnetic clutch that is activated by detection of an infrared signature that approaches the blade.

Further embodiments will be appreciated from a reading of the specification.

DESCRIPTION OF THE DRAWINGS

FIG. 12a shows a sonic sensor system that directs emission and/or detection of sonic vibration away from the propeller to limit spurious signals produced by cavitation.

FIG. 12b shows detail of a sensor for the system of FIG. 12a.

DETAILED DESCRIPTION OF THE INVENTION

Figure 1:
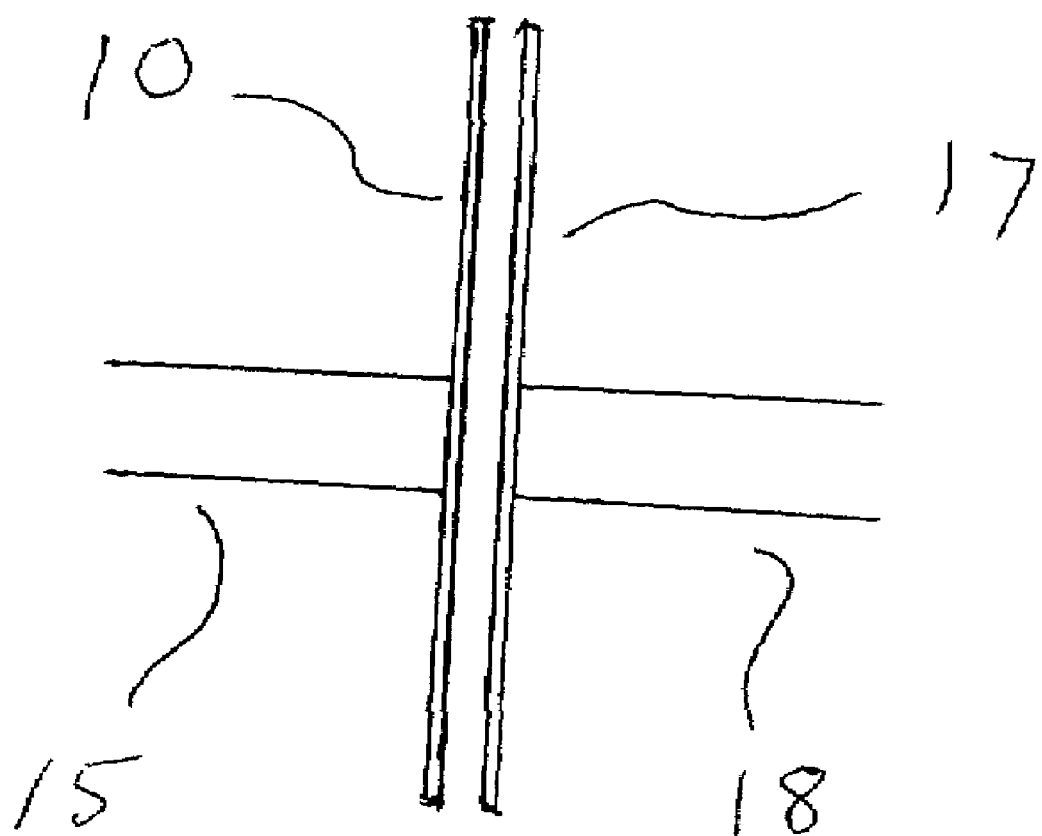
FIG. 1 shows a side view of parallel flanges perpendicular to attached axles.

In an embodiment one or two piezoelectric sensors emit pulses of sonic energy and then detect reflected signals to determine the approach of an object in a danger zone. In another particularly desirable embodiment that responds more rapidly to solid object intrusion, at least one sensor emits a continuous sonic signal and at least one other sensor continuously monitors the signal (or lack thereof to determine approach of an object.

A preferred embodiment includes: a) an electric motor driven propeller water craft; one or more sensors that scan at least most of the danger zone in front of and/or behind the propeller; and c) a circuit that rapidly halts the propeller upon detection of a solid object in the danger zone. In another form, a preferred embodiment includes: a) an internal combustion motor driven propeller water craft; one or more sensors that scan at least most of the danger zone in front of and/or behind the propeller; and c) a circuit that rapidly halts the propeller upon detection of a solid object in the danger zone. In another form a preferred embodiment of the invention includes a) an internal combustion engine driven propeller water craft; one or more sensors that scan at least most of the danger zone in front of the propeller; and c) a circuit that rapidly halts the propeller upon detection of a solid object in the danger zone by activating a friction device attached to the motor and/or propeller shaft.

Although the use with watercraft propellers is described most particularly as examples, the use of devices, methods, systems and materials as described herein specifically are contemplated for use in other machinery such as electric saws, drills, industrial vehicles, robots, heaters, pumps, conveyors and other devices as well.

For purposes of convenience and clarity of the attached claims, the term "danger zone" as used here means a 2 dimensional area that may be upstream or that may be downstream of a device such as a propeller covering a plane perpendicular to an axis of movement. The area may include the circle created by a propeller with the propeller axis at the circle center and the propeller tip at the circle circumference, for the example of a watercraft propeller. The danger zone area may be positioned in front of the propeller by a distance equal to one propeller diameter. The danger zone area may be positioned behind the propeller or other device by a distance equal to, for example, one propeller diameter, 0.5 cm 1 cm, 2 cm, 5 cm, 10 cm, 25 cm, 50 cm, 100 cm, 250 cm, 5 meters or 10 meters. The danger zone area may be simultaneously positioned in front of and behind the propeller by such distance as well. Other positions may be used. In another embodiment for watercraft, the danger zone is positioned in front of and behind the propeller by a distance equal to two propeller diameters.

In yet another embodiment at least one contact (mechanical) switch or continuous sensor is located on a surface of the equipment such as a hull surface to feel when that surface is approached by a solid object such as a hand, foot, head, torso, finger, face, wrench, other tool, rock or muddy bottom of a waterway. Upon physical contact, a switch activates, and switches a warning device such as a buzzer and/or stops a propeller. The propeller may be stopped for a set period of time such as 1, 2, 3, 5, 10, 20, 30, or 60 seconds or simply switched off.

Desirably, a memory device such as a microprocessor records the event, which can be read out later. Also desirably, a custodian of the watercraft, who may be renting the watercraft to the operator, is informed of the event by automated radio signaling. The signaling optionally includes an ID code denoting which watercraft had the event and optionally includes a code denoting how fast the watercraft was traveling when it had the event. In yet another embodiment the system further includes a motor governor circuit that automatically limits the motor power or propeller speed temporarily or permanently upon sensing a predicted collision. In yet another embodiment a kit is provided for adding an electronic propeller guard to a watercraft, including sensors and circuits as described herein, along with one or more fasteners for attaching sensor(s) to the watercraft surface, such as bolts, glue, tape, screws, epoxy, clamps and the like.

Systems that Contain Sensor and Activator Circuits

An electronic guard in a preferred embodiment comprises a sensing component (circuit or circuit component) and an activating component (circuit or circuit component). The sensing component may pulse monitor or may constantly monitor most (at least 50%), substantially all (at least 90%), virtually all (at least 95%) or all (100%) of danger zone area(s) and detects intrusion of an object into one or more zones. A danger zone preferably is anywhere between the propeller itself to 50 propeller diameters upstream or downstream of the closest side of the propeller surface. In one embodiment the zone is determined at a distance between 5 and 20 propeller diameters from the propeller. In another embodiment the zone is determined at a distance of 5 diameters from the propeller. In yet another embodiment the zone is determined at a distance of 2 diameters from the propeller.

Upon detection of a solid object, a signal controls an activator circuit that rapidly stops or slows (ie. decreases to less than 60 rpm and preferably less than 10 rpm) the propeller or other device (such as a saw blade) within 0.5 seconds. In one embodiment the activating circuit rapidly stops or slows the propeller or other device within 0.2 second. In other embodiments the circuit stops or slows the propeller or other device within 0.1 seconds, 0.05 seconds, 0.025 seconds, 0.01 seconds, 0.005 seconds and even within 0.002 seconds.

In a desirable embodiment the activator circuit activates one or more electromagnets to decouple motion through a clutch or torque converter as described herein.

In another embodiment a tactile sensor is located on a hull surface upstream from a propeller and extends at least 1, 2, 3, 5, 8, 10, 15 or 24 inches away from the hull. Two or more sensors can be spaced apart to sense solid objects in a wider volume. In this embodiment a defined "danger zone" per se is not necessarily determined. This embodiment is particularly valuable for sensing rocks on the bottom that may collide with a propeller. In a particularly preferred embodiment, such tactile sensor outputs more than a simple on-off signal. For example, a tactile feeler may be connected to a potentiometer, hall effect sensor, magnet or other device that is used to generate a signal that is proportional to the amount of deflection in the tactile sensor. In an embodiment, a light, buzzer or other signaling device alerts a boat operator to various degrees for example, by increasing the volume of sound as the tactile sensor is deflected more.

This sensor/alert device and/or propeller shut off system is particularly useful when installed on rental watercraft. A major problem with rental craft is the destruction of propellers and propulsion systems by careless users. An alert system as described here can prevent boat damage by at least three different actions. One, a sensed propeller collision can trigger an automatic motor shut down or limit in power, for a set period of time or until the boat returns to the custodian, who may reset the motor power. Two, the system can record instances of detection, and make a record, to be reviewed by the boat caretaker (renter) later on, such as when the caretaker needs to make a decision on giving a withheld damage fee back to the renter. Three, the system can alert the boat caretaker by wireless transmission. The latter technique is particularly useful where the receiver is located at a high enough position to receive signals and no island or other structure blocks transmission. The boat caretaker may respond by controlling the boat via a radio command or by calling the boat operator. For low cost operation, it is very desirable to use family radio, which is particularly suited over water, in many cases for up to two miles of line of sight.

In an embodiment the sensor turns off the propeller or other device and an override switch must be activated to turn the propeller or other device back on. In yet another embodiment a memory device such as a microprocessor records the event and can inform others such as an employer, a court, an employment agency, a government, an insurance company, or a government agency of the collision, or near collision history. In yet another embodiment the equipment such as a boat further comprises a wireless transmitter that sends signal(s) to a receiver indicating the collision/near collision problems in real time, and/or optionally, other information such as boat speed. The wireless reporting of such information and related risky behavior of collisions with solid objects in real time may be used for other embodiments of the invention as well. For example, a probation office or insurance company can obtain great value from monitoring near collisions of a monitored vehicle driven by a monitored individual.

In an embodiment that intends to protect people who fall directly or nearly directly on top of the propeller, a danger zone in front of the propeller is extended to include an area vertically above and immediately in front of the propeller, hereinafter termed "extended danger zone." By "an area above and immediately in front" is meant a rectangular and horizontal surface area beginning above the top of the propeller arc (immediately at the top of the propeller arc or up to one propeller diameter above that point). The rectangle width is the propeller diameter and length extends from the rear of the propeller forward two propeller diameters or until a hull surface is reached. An extended danger zone also may exist behind the propeller.

Figure 14A:
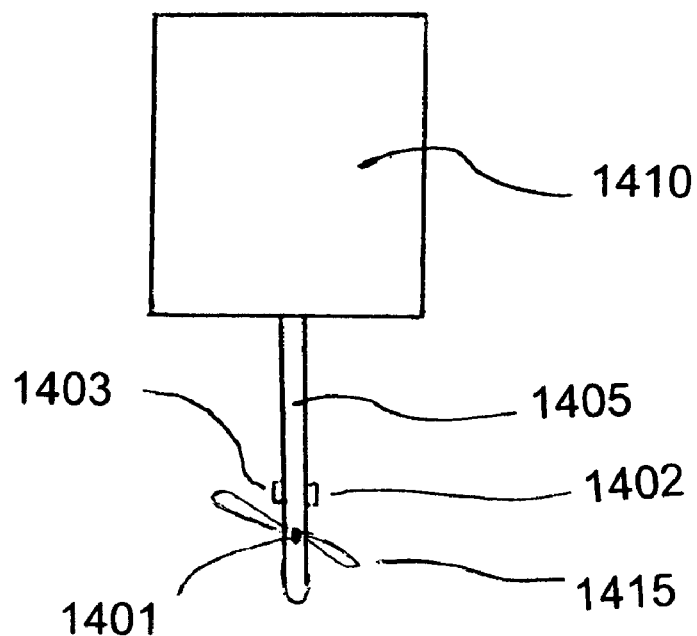
FIGS. 14a and 14b show front and side views, respectively of one, two and three sensor systems for detecting imminent propeller contact with an outboard electric motor.
Figure 14B:
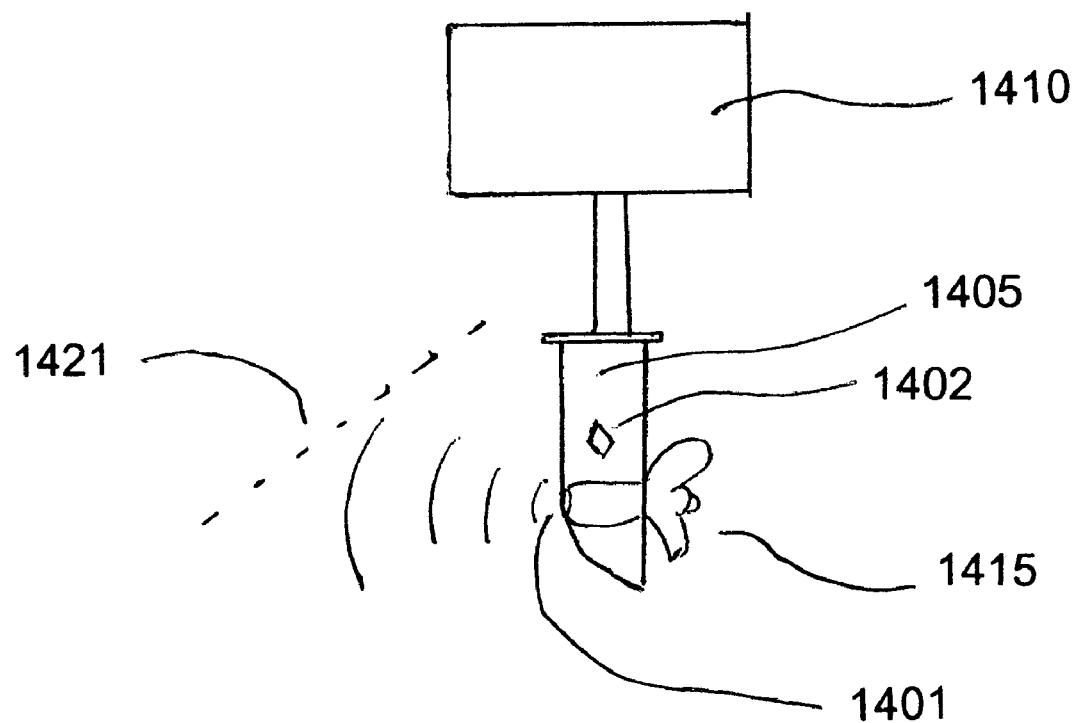

By way of example as seen in FIG. 14b, an extended danger zone for a 10 inch propeller 1415 consists of partly horizontal (45 degrees from horizontal) area 1421 (see dotted line, which is a cross sectional side view) that extends above propeller 1415 and ahead, and utilizes sensor 1402. Not shown in this figure is another sensor directly behind sensor 1402 and that monitors the other side of the drive shaft (including the right half of the partly horizontal zone). Both sensors are directed up towards the water surface and forward towards the front of the boat. In one embodiment the sensors are directed between 30 and 60 degrees down from the horizontal, facing forward. When a piezoelectric crystal sonic sensor is used for this embodiment, the flat surface of the crystal preferably is perpendicular to the desired angle. Of course, other danger zones and extended danger zones may be desired and used depending on the circumstances of each specific application and the examples provided herein are representative in that regard.

A sensor which monitors the danger zone or extended danger zone signals an activator to quickly halt the motor upon sensing an intrusion into that zone. Of course, most sensors will respond to intrusion into a larger zone than that defined here. A sensor often will monitor a much larger area and space, and the "danger zone" and "extended danger zone" defined here are minimum areas that should be monitored for satisfactory operation.

In an embodiment the sensor outputs a signal that triggers an activator circuit that quickly halts the electric or fossil fueled motor which drives the propeller. The activator may be as simple as a control component such as a resister, MOSFET, relay or capacitor involved in signaling or that directly controls the electric motor power or a motor circuit, or a power circuit that energizes a brake (and/or shuts off ignition) in a fossil fueled system but generally will comprise a larger portion of an overall control circuit that dissipates the motor kinetic energy or, more preferably applies an opposing field to actively push against the angular kinetic motion of the motor shaft. In one embodiment of the invention a friction brake halts the fossil fueled motor without halting an ignition high voltage (spark) pulse and preferably halts between sparks. In another embodiment that employs a fossil fuel powered engine an ignition spark is interrupted and a friction brake is energized.

Upon activation by the activator circuit the motor control decreases propeller speed to below a value, (preferably 120 rpm or less, more preferably 60 rpm or less, yet more preferably 30 rpm or less, more preferably 10 rpm or less) and more preferably stops the propeller before an object detected in the danger zone can contact the propeller.

Preferably the motor shaft directly couples to the propeller, to allow rapid changes in angular shaft momentum without an intermediary transmission (gear(s) belt(s) or other means) to change rotation speed. A big problem with some watercraft that hinders optimum use of an electronic propeller guard as described here is the inability of many motor/transmission/propellers to suddenly stop without damaging the motor or (if used) transmission. Another problem has been the inability to rapidly slow or stop the propeller with a few revolutions or even within a single revolution. An embodiment to address this problem uses a an electromagnetic clutch, a clutch plate or other mechanical d vice which disconnects the motor shaft from the motor and/or transmission (i.e. reduction gear).

The Sensor Circuit

In an embodiment, a sensor circuit comprises one or more electronic components that output an electric signal indicating intrusion of a solid object ((i.e. has enough mass and density or other characteristic to interact with a signal such as a sonic wave or infrared signal) into water in front of a sensor. A large variety of sensors may be employed that can scan the water (and in some cases air space above the water) immediately in front of, to the rear of, and/or above and below the propeller during propeller motion. Galvinometric devices can be used by measuring conductivity in the water and detecting intrusion of a body that differs in conductivity. Galvinometric (conductivity) measurements generally require use of strong signal processing or filtering to remove unwanted signals such as that produced by wave and bubble activity. These and radio wave devices using pulsed or constant energy fields can be used to sense such objects and/or their movement, as, for example, described in U.S. Pat. Nos. 5,694,653; 3,329,929 and 5,019,822 and described by Gagnon and Frechette, IEEE Annual International Carnahan Conference on Security Technology (Oct. 12–14 1994 meeting in Albuquerque N. Mex., pp. 26–30).

A tactile sensor may be an on-off switch such as a microswitch connected to a feeler such as a wire whisker or stick or fin. A wide variety of tactile sensors are known and may generate continuously varying signals. For example, an optic fiber may be used that alters the degree of deflection by optic changes within the fiber as the light path shortens or lengthens with bending. A hall effect sensor (or conjugate magnet) may be attached to a probe on the inside of a boat and generate a signal as the probe moves.

Sonic Sensing with Piezoelectric Devices

Most preferably a sensor uses piezoelectric device based sonic sensing within the water, with either (a) at least one piezo device as a transmitter and at least one piezo device as a receiver or (b) one piezo device that acts as both transmitter and receiver, by alternately sending an acoustic signal and then detecting reflection of that signal. The term "sensor" as used herein includes both (a) and (b) type acoustic sensors. The piezo substrate movement generates a voltage that is amplified and compared or adjusted to make a control signal. This sensing technique is known, as for example, exemplified in U.S. Pat. Nos. 5,146,208; 5,168,471; 5,168,473; 5,313,556; 4,349,897; 4,780,085; 5,209,237 and 5,418,359.

Preferably the sound energy is continuously created as a pulse, or more preferably as a continuous tone or tone pattern. For faster response it is particularly preferred to use ultrasonic frequencies over 20,000 hertz, although audible frequencies also may be used. This is because many desirable lock in circuits require detection of one or several complete cycles to lock in and make an accurate detection of a reflected or refracted sound, or sudden loss in the sound. By way of example a lock in circuit that requires detection of two cycles of a particular frequency will require at least 0.002 seconds to detect the presence or absence of a 1 kilohertz wave and may require even more time. Other circuits that generate or detect more complicated waveforms or patterns likewise require a minimum frequency and or periodicity of pulse for fast response. Preferably a constant energy output device is used that generates a constant frequency of at least 8 kilohertz, more preferably at least 20 kilohertz at least 40 kilohertz, at least 80 kilohertz, at least 150 kilohertz, at least 0.500 kilohertz, at least 1 megahertz, at least 2 megahertz, at least 5 megahertz, at least 10 megahertz, at least 25 megahertz or even at least 50 megahertz. At the higher frequencies, particularly above 1 megahertz, a combination of radio wave reflection and sonic reflection may be used. In particular, high frequency reflection of radio waves from plastic piezoelectric polymers are useful for embodiments, as these devices can radiate and absorb electromagnetic energy well.

Higher frequencies of above 20,000 and particularly above 40,000, 100,000, 200,000 and even above 1,000,000 hertz are particularly desirable to improve response time, efficiency and directionality of transducers used for sonic sensing. The higher frequency energy has corresponding shorter wavelengths. In an embodiment a transducer is used having at least one vibrating (or vibration sensing) surface in contact with water that is approximately (within 10 percent, preferably within 3 percent) the same length as the wavelength of the sonic wave in water. The wavelength of the sonic wave in water is determined by dividing the speed of sound in water by the frequency of the sonic vibration. In an embodiment one or more sonic transmitters are used with such dimensions together with one or more detectors that can be of any size. This is because efficiency and directionality of the transducer is more important for the transmitter than for the detector for embodiments that utilize separate devices.

In an embodiment, frequency discrimination is obtained by use of a sensor with a high q value such that only energy having a wavelength at or very close to the resonant frequency of the piezoelectric crystal causes an electrical signal from the sensor to associated circuitry. This embodiment is important for a fast response time. Lock in control circuits tend to take time to lock in a signal, and this delay time is very undesirable. Filtering by the sensor itself, particularly using a constantly on transmitter provides a faster response time. Generally, a piezo electric sensor that responds less than 10%, 1%, 0, 1%, 0.01%, or even less (measured as output voltage using a 11 megohm input, voltage measuring device) as well to frequencies that differ by 2% is desired. By way of example, a 200 kilohertz sensor preferably responds to a 204 kilohertz signal with an output attenuated by at least 10 fold compared with that for a 200 kilohertz signal of the same strength. Inorganic crystals generally are good in this regard. In an embodiment, a polymer piezoelectric sensor advantageously is incorporated into a resonant circuit, by adding inductance, capacitance, and/or resistance parallel to and/or serially to the piezoelectric component, as a skilled artisan in electronics will appreciate, to obtain better frequency discrimination. By placing the piezoelectric device within a tuned circuit, the circuit output can discriminate better against other background signals. Desirably the piezoelectric device is coupled at a high impedance circuit of at least 100 kilo ohms, 300 kilo ohms, 1 meg ohms, 2 meg ohms or even at least 10 meg ohms.

Particularly desirable is the use of a ceramic or other solid piezoelectric transmitter operating at a resonant frequency and/or selected overtone frequencies, together with a plastic piezoelectric detector that responds to a wide range of frequencies. It was discovered that organic polymer piezoelectric devices (such as plastics) are very useful for sensing but work best when used together in a system with inorganic devices (such as a ceramic) as transmitters. Accordingly, in an embodiment a preferred sensor includes an inorganic device as a transmitter and an organic device as a receiver. The two devices in many permutations are best placed at different locations of a hull or hull extension, with a transmitter sending energy away from the hull in one direction and the receiver facing away at a different direction to receive energy. In one embodiment the transmitter and receiver directions are approximately ninety degrees (ie. 30 to 150 degrees, more particularly 45 to 135 degrees) apart. This orientation, while not that useful for determining distance, is very useful for robust yes/no detection of solid objects, because scattered energy that may reflect off of surfaces further away than the danger zone will be greatly diminished as a result of the positional orientation.

In a desirable embodiment two frequencies or pulse types are used together to sense two different danger zones simultaneously. For example a starboard side piezoelectric transmitter may be used at 40 kilo hertz and emits 40 kilohertz sonic waves on the starboard side. A port side piezoelectric transmitter may be used at 60 kilo hertz and emits 60 kilohertz sonic waves on the port side. A piezoelectric detector that responds to both signals (one representing a port side danger zone and the other representing a starboard side danger zone) may be placed in the center and generates electrical signals corresponding to both zones. A wide bandwidth sensor such as a plastic piezoelectric should be used in the embodiment where one sensor detects two different kinds of signals. Of course, one or more separate detectors may also be used for each transmitter and multiple common detectors may be used, as well as combinations of this. In yet another embodiment three or more different transmitters are used with one or more sensors. In yet another embodiment two pulsed transducers use the same frequency but are synchronized, as described in U.S. Pat. No. 6,377,515 issued Apr. 23, 2002.

In a most simple arrangement, flat or mostly flat sensors are mounted on different portions (hereinafter "control surfaces") of the boat hull. Preferably the transmitter constantly sends out a signal or pulses the signal. In one embodiment the receiver constantly reads a reflection signal, and a difference in the received signal (increase in reflected signal compared to a previous background signal) indicates entry of an object into the danger zone or extended danger zone.

The sensor circuit(s) should be tuned to detect only solid bodies in the immediate vicinity and in the danger zone or extended danger zone. Preferably the sensed zone will be larger than the danger zone (or extended danger zone) in order to provide a greater margin of safety.

Another embodiment uses galvinometric measurements to detect intrusion of a solid body into the danger zone. In this case one or more electrical measurement are continuously made (by pulsing, application of a varying electric current, or direct current, or a combination) between two or more electrically conductive contacts on a control surface(s). A change in conductivity (or related parameter such as impedance if using a varying electric current) indicates the entry of a solid body. In a simple case, an increase in resistance is detected by monitoring a sudden decrease in current between two electrodes. This embodiment of the invention works best with a high frequency (radio frequency) field because such field can be set up more precisely between two points and can be altered specifically by the presence of living tissue that contains electrolytes and that interferes with the electromagnetic (radio) field. Yet another embodiment uses infrared sensor(s) to detect an object, as for example described in U.S. Pat. No. 5,369,269.

For galvinometric (or radiowave field) detection it is best to continuously monitor the space between control surfaces and to detect changes above a baseline conductivity or field strength to signal intrusion of a solid body. This is desired because different waters and conditions can give very different conductivity and/or field penetration characteristics. For example, when the boat moves into water that is more salty, the sensors will detect greater conductivity and/or altered field strength penetration. Such simple filtering for sudden changes allows automatically cancellation of slow changes in background signal and improves system performance. Accordingly it is most preferred to use a comparison step whereby the sensor output continuously is compared with a running average to detect rapid changes above a threshold as for example described in U.S. Pat. No. 4,890,265. In another embodiment a reference signal is used with two or more electrodes or sensor surfaces positioned near each other and by detecting the background change in water conditions (for example conductivity changes) for a comparison. An additional reference sensor similarly can be used for background adjustment for acoustic detection as well.

The Activator Circuit

The activator rapidly stops the motor upon being triggered by the detector and thus halts the propeller. In practice, the sensor and activator "circuits" often are separate portions of a common circuit since they are best combined into a common design. The activator circuit may act upon a fossil fuel powered boat by interrupting ignition sparks to the sparkplug(s), if used and by engaging a friction device. For use with an electric motor, the activator energizes or alters an electromagnetic field(s) to halt the motor movement.

In preferred embodiments for use with internal combustion engine driven propeller systems, the activator interrupts high voltage pulses to the spark plugs and also engages a friction device to absorb kinetic energy of the motor and propeller shaft. A large variety of means for stopping voltage pulses to the spark plug(s) are easily determined by a skilled artisan. The friction device preferably is attached to the motor crankshaft and/or propeller shaft.

A preferred friction device for internal combustion engines is a disk or other solid surface that is attached to the motor and/or propeller shaft and upon which a disk brake pad or shoe applies force, slowing or stopping the rotation. A variety of devices are known that that rapidly stop a spinning axle. For example, Bendix Corporation has designed and sold a variety of friction brake and friction clutch devices, and represents some of the known engineering that may be applied to this embodiment of the invention.

Magnetic braking also may be used to rapidly stop or slow a propeller shaft. In one embodiment a permanent magnet is mounted to the shaft and rotates within a surrounding electromagnet. When braking is desired an electrical current is applied to the electromagnet in a manner (polarity, timing etc) such that the induced electromagnetic field(s) oppose the permanent magnet field(s). This permanent magnet and electromagnet system also may be used as a starter motor for the internal combustion engine and as an electric generator. In another embodiment both the shaft and the surrounding fixed magnetic fields are created by electromagnets, in which case brushes may be used to provide a connection to the moving shaft electromagnet (armature).

In preferred embodiments for stopping an electric motor the activator circuit (or portions of the larger combined circuit) reverses direction of an electromagnetic field of the motor by reversing the polarity of the electric current flowing through the one or more electromagnets until the motor has come to a stop, or a near stop (preferably less than 100 RPM, more preferably less than 60 RPM and most preferably less than 10 RPM) within 0.5 seconds. In another preferred embodiment activator circuit halts the motor within 0.2 seconds and in another preferred embodiment the activator halts the motor within 0.1 seconds. Where the propeller is driven by a separately excited brushed motor the polarity of the fixed coil (outside the armature) is reversed and the back emf or the motor (or motor/propeller rpm) may be monitored until the speed has dropped to zero or below a low detectable value.

Other procedures to rapidly brake electric motors are known and are useful. In the case of a simple permanent magnet motor, the motor kinetic energy may be suddenly absorbed by a circuit that shunts the drive leads to a low resistance. Preferably the polarity of applied voltage is reversed, in a manner that does not overstress the motor. Numerous techniques for rapidly braking an electric motor are known and contemplated for this embodiment of the invention. Examples of such control systems may be found, for example, in U.S. Pat. No. 6,094,023 (Method and Device for Braking an All-mains Motor); U.S. Pat. No. 5,847,533 (Procedure and Apparatus for Braking a Synchronous Motor); U.S. Pat. No. 5,790,355 (Control System); U.S. Pat. No. 4,933,609 (Dynamic Control System for Braking DC Motors); U.S. Pat. No. 3,628,112 (Dynamic Braking of Electric Motors with Load Changing During Braking); U.S. Pat. No. 3,548,276 (Dynamic Braking of Universal Motors); and U.S. Pat. No. 3,794,898 (Dynamic Braking of Electric Motors with Thermistor Braking Circuit), the contents of which specifically are incorporated by reference in their entireties.

An example of rapid braking of high power three phase motors is the product by MTE, a United Kingdom company with a website at entrelec-mte.co.uk. The emergency braking system that is commercially available from this company can be adjusted to halt a motor within 0.5 seconds but could be modified for even shorter stopping times. A boat propeller motor can be halted faster than a corresponding electric car motor because of the lower torque involved with the propeller compared with the car.

Rapid braking of direct current brushless motors is also known to the skilled artisan. The use of a feedback signal based on the back EMF of the motor triggers current flow from the motor into a controller to facilitate an emergency stop, as described for example in U.S. Pat. No. 5,659,231. Also relevant in this context are the disclosures of U.S. Pat. Nos. 6,215,261, 6,084,325 and 6,078,156. Another improvement to resistance based dissipation of motor kinetic energy for brushless motors is described by U.S. Pat. No. 4,426,606. This latter patent teaches a way to dissipate energy stored in the inductance of the winding of the brushless motor by selecting a capacitance to match the winding inductance.

Further systems for adding energy into a motor to oppose the forward motion of the motor are well known and an engineer can find such circuits and techniques in the regular literature. In each such preferred embodiment, a rapid braking circuit activates upon sensing an object upstream, near to or within a danger zone or extended danger zone by the sensor circuit. Preferably two or more sensors are used for broader coverage of a danger zone. Even more preferably time averaging is carried out to detect changes in detected signals and eliminate spurious background signals.

Design and Use of Magnetic Torque Converters and Rapid Clutches

In a desirable embodiment useful for electronic propeller guards and other devices, two rotating surfaces, each with an attached axle, may be kept apart by a small distance via a bearing, and, if each surface comprises at least some magnetically responsive material and at least one contains a magnet (which may be that magnetically responsive material), the magnetic field across the small distance can transfer rotation force from one axle to the other. Many variations of these scheme may be used. For example, a bearing such as a thrust bearing may hold the surfaces apart at a defined distance, a mechanism such as a spring, another magnetic field, or any other magnetic field control device may be used to control the magnetic field between the surfaces (by adding to, subtracting from the magnetic field, by altering the spacing between the surfaces, by addition or removal of magnetically responsive fluid between the surfaces, etc), and thus control the torque transfer between the attached axles to form a variable ratio transmission. One or more permanent magnets may be included, particularly on the periphery of a rotating surface, to establish a magnetic field between the surfaces. The magnets may be round, an irregular shape, or other regular shape and may comprise for example, 1 to 100 percent by weight of a flange, desirably at least 3, 5, 10, 20, 25, 30, 40, 50, 60, 70 percent by more, per weight of the flange (not including the axle weight). An electromagnet may be used, in a rotating part or at a fixed position to a rotating part, to modulate the magnetic coupling between the surfaces. The electromagnet may be pulsed with a very high electric current for a short time and thus temporally disengage the surfaces from each other or weaken the coupling between them.

A most desirable embodiment of the invention exploits the inherent constant torque of a magnetic coupler as described herein, for clutching and/or variable ratio transmission applications that do not require high starting torque. Watercraft propeller drive systems, elevators, screw conveyors and the like, for example, have greatly differing torque requirements from that of land vehicles, which often require motors and transmissions that can handle high starting torques. Generally speaking, the transmissions, clutches, and torque converters developed for the automobile industry are designed for high torque at low starting speed, and lower torque at high speed. Many of the reviewed devices are designed for the auto industry and generally include features and complexity associated with high starting torque. In contrast, the torque needed for a boat propeller starts low and, in many instances gradually increases with increasing rpm.

In an embodiment, one or more magnets are oriented to direct their fields across the space between two rotating flange surfaces and may be positioned to couple mechanical force between two axles through that space. The junction space in some embodiments is perpendicular to the axis of rotation and often comprises a large flat surface. Furthermore, by addition of one or more bearings at the surface it was found that surfaces on either side of the space may be held together by magnetic fields while allowing independent rotation. It was discovered that this arrangement is surprisingly useful for the torque requirements of powered propeller driven watercraft and other machines such as screw conveyors. In an embodiment, magnets can be used that have fields oriented perpendicular to or at another angle with respect to the rotation axis. In many embodiments, the delivered rotational force to a downstream axle such as a propeller shaft starts out as low torque at low rpm and increases gradually at higher rpm (e.g. up to 10%, 25%, 50%, 100%, or 200% over the useful rpm range). Changing the propeller (or other downstream energy absorber) alters the desirable torque vs rpm relationship. Accordingly, a magnetic arrangement as described herein can more suitably match loading torque for higher motor use efficiency. The transfer of power across a junction as described here can match the power needed to drive (for example) a propeller better than that supplied by many other devices. In a desirable embodiment the magnetic field across the distance between the flange surfaces is altered to adjust the torque transfer between the two axles.

Most desirably a torque converter or axial connector comprises a configuration of two rotating axles connected by magnetic field coupling across a junction between the ends of the axles that are separated by one or more bearings that allow independent rotation of the two surfaces perpendicular to the rotating axis. Most preferably, in easy to manufacture embodiments, each axle end terminates in a wider flange that has one or more magnets within it. By "wider" is meant that the average diameter of rotating surfaces that are perpendicular to the rotation axis are wider than either axle. Preferably the average surface diameter is 1.5 to 20 times the average axle diameter, more preferably between 2 to 10 times and more preferably between 2.5 to 5 times the axle diameter. One or more magnetic fields of one polarity are thereby established in a first flange of a first axle and one or more magnetic fields of a different polarity are also established in a second flange of a second axle. Desirably, the flanges have major surfaces that face each other and each oriented within 85, 75, 60, 50, 45, 35, 30, 20, 15 or even less degrees away from the perpendicular to the rotating axis. In other embodiments the magnets are oriented radially and the flanges are not perpendicular to the axes but concentric (at least part of each resides as a sleeve within the sleeve of the other) with each other. Thus, the flanges may assume more complicated three dimensional structures that have magnetic attracting surfaces or localized points in close proximity to each other. By positioning the two flanges together, rotational movement in one flange is transmitted into rotational force in the other. One or more bearings may be placed between the flanges to allow them to rotate past each other with low friction, and thereby allow torque conversion. Preferably, when used in a watercraft or other device that does not require a high starting torque, a reduction in rotation speed occurs, along with change in torque.

Bearing(s) Sandwiched by Two Axle Surfaces with Opposing Magnetic Fields

One embodiment comprises two axle surfaces that are held together by one or more magnetic fields. To maintain freedom of rotation the surfaces contact one or more bearings at the junction. Preferably one large circular race trace bearing is used and the magnetic field coupling (force per unit surface area) is greater outside (further away from the axle) than inside the circular bearing.

An axle may be any shape but typically is rod like and usually between 0.1 to 8 inches in diameter. In many watercraft applications the axle is between 0.2 to 3 inches in diameter and more desirably between 0.4 and 1.25 inches diameter. The axle may be of any material such as stainless steel, aluminum, aluminum alloy, titanium, strong polymer, deldrin and the like. A low mass high strength polymer or composite such as glass or carbon fiber filled epoxy, aluminum, aluminum alloy or the like is particularly desirable for an axle that is connected to a propeller as part of an electronic propeller guard system. Desirably the material is not paramagnetic. Use of a low mass downstream axle provides less inertia for more rapid stopping of the propeller. The axle may comprise or may be connected to a torsional damping device. Devices, such as those reviewed in U.S. Pat. No. 6,508,713 and the new device claimed in that patent, are particularly useful in combination with embodiments of the invention.

Figure 2:
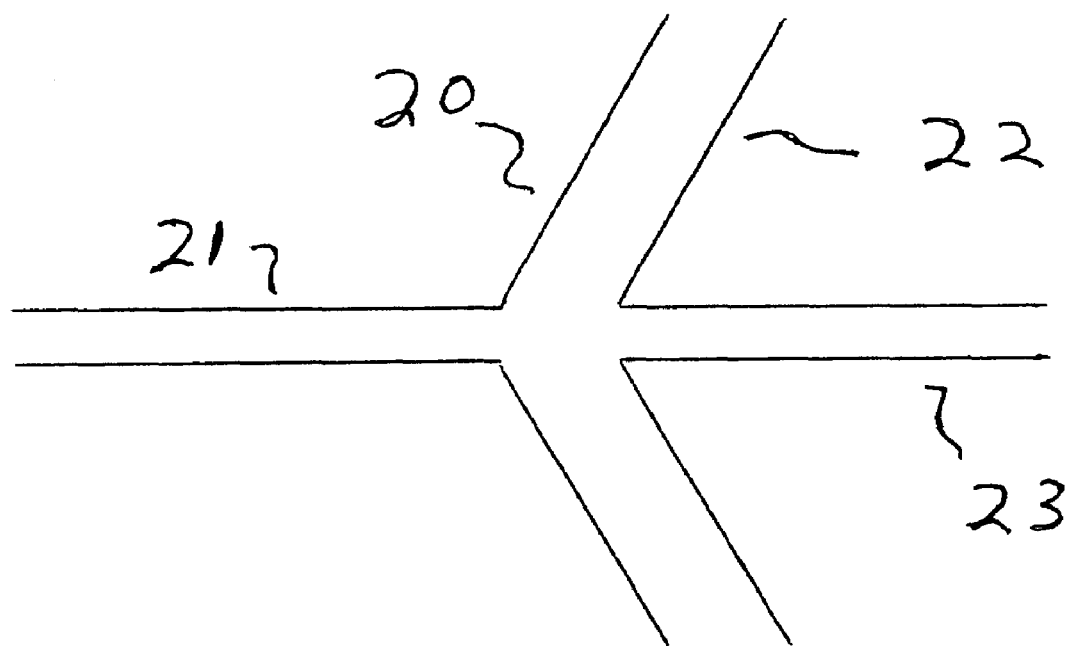
FIG. 2 shows a side view of parallel flanges that are not perpendicular to attached axles.
Figure 3:
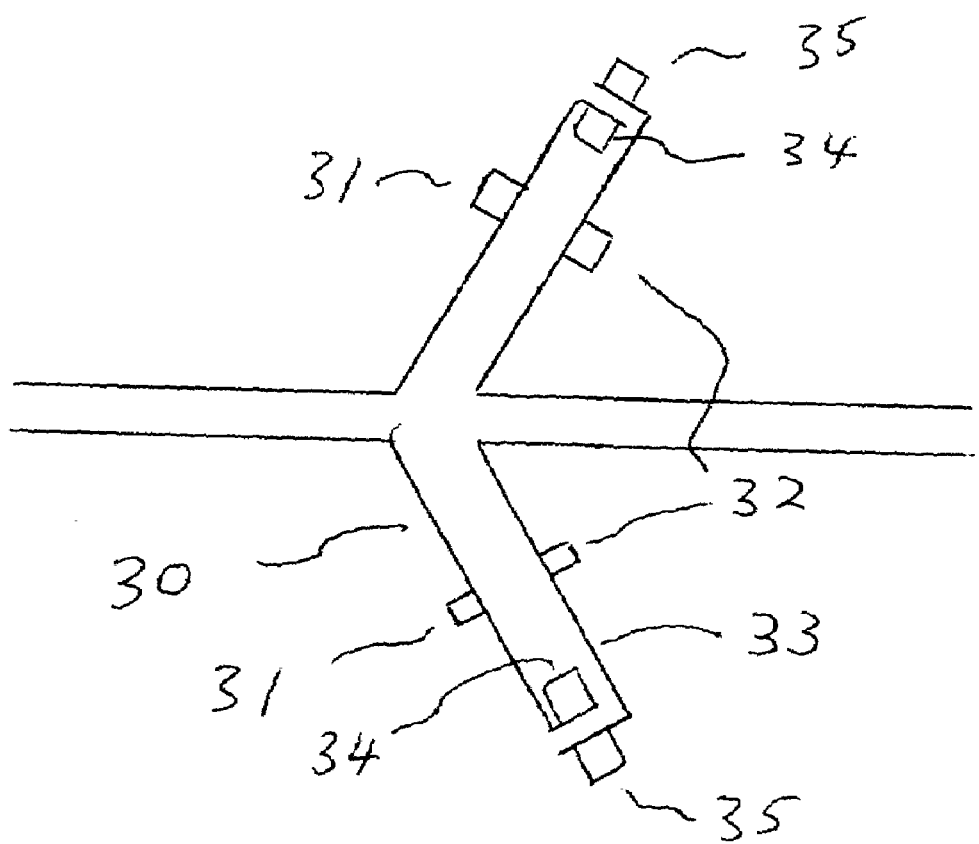
FIG. 3 shows representative placement of magnets with opposing poles facing each other.

The end of the axle in many embodiments is widened, such as into a flange having at least one surface portion that is perpendicular to the axis of rotation. The flange preferably is round with a center at the axis of rotation and typically is between 1 to 20 inches, preferably 2 to 12 and more preferably between 3 to 9 inches in diameter. The flange can assume a variety of shapes. FIGS. 1 and 2 depict some examples of shapes. As seen in FIG. 1, the flange may have a major surface that is perpendicular (i.e. within 80 to 100 degrees, preferably 85 to 95 degrees, more preferably 88 to 92 degrees, yet more preferably 89 to 91 degrees angle) from the axis of rotation, and both axles share the same rotation vector. Typically two of such flanges are combined with opposing surfaces facing each other, are held together by opposing magnetic fields, and allowed to rotate by one or bearings within each or between them. Such bearings may be regular precision bearings. FIG. 1 shows flange 10 with axle 15 of a first face plate coupled to flange 17 with axle 18 of a second face plate. In another embodiment shown in FIG. 2, the flanges have matching (parallel) surfaces that depart from this angle and may even appear cone shaped. As seen in this side view, flange 20 has attached axle 21 and flange 22 has attached axle 23. An angular thrust bearing is not shown. FIG. 3 shows some representative magnet placements. Magnet 31 on flange 30 couples with magnet 32 on flange 33. Also shown here are magnets 34 and 35 on concentric portions of these flanges. Other magnets and the rest of the flange structures are not shown in this very simplified side view.

Although conformations, sizes, and placement of individual magnets are exemplified in the text and figures presented here, it is emphasized that a wide variety of conformations, sizes, placements and numbers of magnets may be used to create torque transfer between two flanges that rotate on a common axis and with parallel surfaces, as will be appreciated by a skilled mechanical engineer or physicist axles. In a particularly desirable embodiment a flange comprises a magnetic field responsive material in a flange made out of steel and attached to a bearing in the flange, a second flange has the other bearing half and some magnets within the latter flange exert a force upon the steel when the two flanges are assembled.

In another embodiment, a first set of magnets are placed closer to the center of the flange inside a large race track bearing. A second set of magnets are placed outside of the bearing. In an embodiment, the inner magnets are oriented to exert magnetic fields perpendicular to the flange surface and primarily hold the two flanges together while the outer magnets are oriented with fields perpendicular to the flange surface or at least partially parallel to the direction of rotation. The term "at least partly parallel to the direction of rotation" means at least 5 degrees, 10 degrees, 15 degrees, 20 degrees, 35 degrees, 45 degrees, 50 degrees, 60 degrees or even more away from the rotation axis vector.

In another embodiment, a rod shaped magnet is inserted into a hole that is oriented parallel to the rotation axis. The magnet may be manufactured with north-south poles that are oriented at least partially away from the long axis of the magnet. A magnet as described herein may be prepared by pressure fitting neodymium iron cobalt (or other material such as magnetizable ceramic) particles into a shape under influence of a strong magnetic field. In another embodiment a magnet such as a rod magnet may be manufactured with magnetic fields that emerge parallel to the magnet surface (ends of the rod) but then at least one end face is machined to an angle such that magnetic force lines emerge from the surface in a non-perpendicular direction. In a desirable embodiment rod magnets are inserted into round holes of the flanges and may be fixed by an adhesive such as an epoxy. In another embodiment an entire flange or concentric (annular) region(s) of a flange is a permanent magnet. In a related embodiment two or more regions are magnets and have polarities opposite each other, and form a combined magnetic field through the junction into the opposing flange by virtue of this.

In some embodiments that use this conformation, the two axles have self-centering capability because movement of one or both flange surfaces away from the center axis will result in a mechanical force back into alignment. For this embodiment the use of angular contact bearings, chosen to accommodate the angle of contact between surfaces is particularly desired. Most preferred are conical matching surfaces with nominal contact angles of 15 degrees, 25 degrees, or 65 degrees, as many angular contact bearings are available for this angle.

The flange may have one or more ball thrust bearings such as radial ball bearings that occupy deep grooved circular space(s) on the surface of one or (preferably) both flange surfaces. The inside diameter may be, for example, between 0.5 and 15 inches, preferably between 1 and 10 inches. Permanent magnets may be mounted on the inside and/or outside of a bearing race. Although permanent magnets are exemplified in the figures, electromagnets also can be used in combination or separately on one or both flanges, and slip ring(s) or brushes may be used to supply power to the electromagnet(s). Furthermore, one of the flanges may even lack a magnet and instead comprise iron or other paramagnetic material that is attracted to magnet(s) on the opposite flange.

Figure 4:
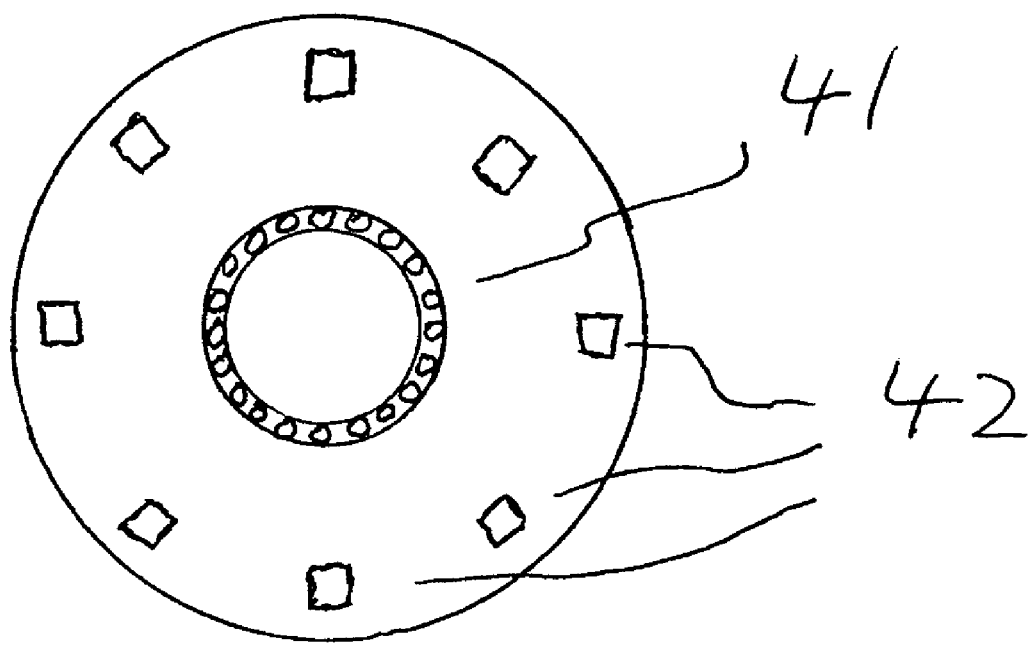
FIG. 4 is an end view of a flange, with a single bearing and 8 magnets.
Figure 5:
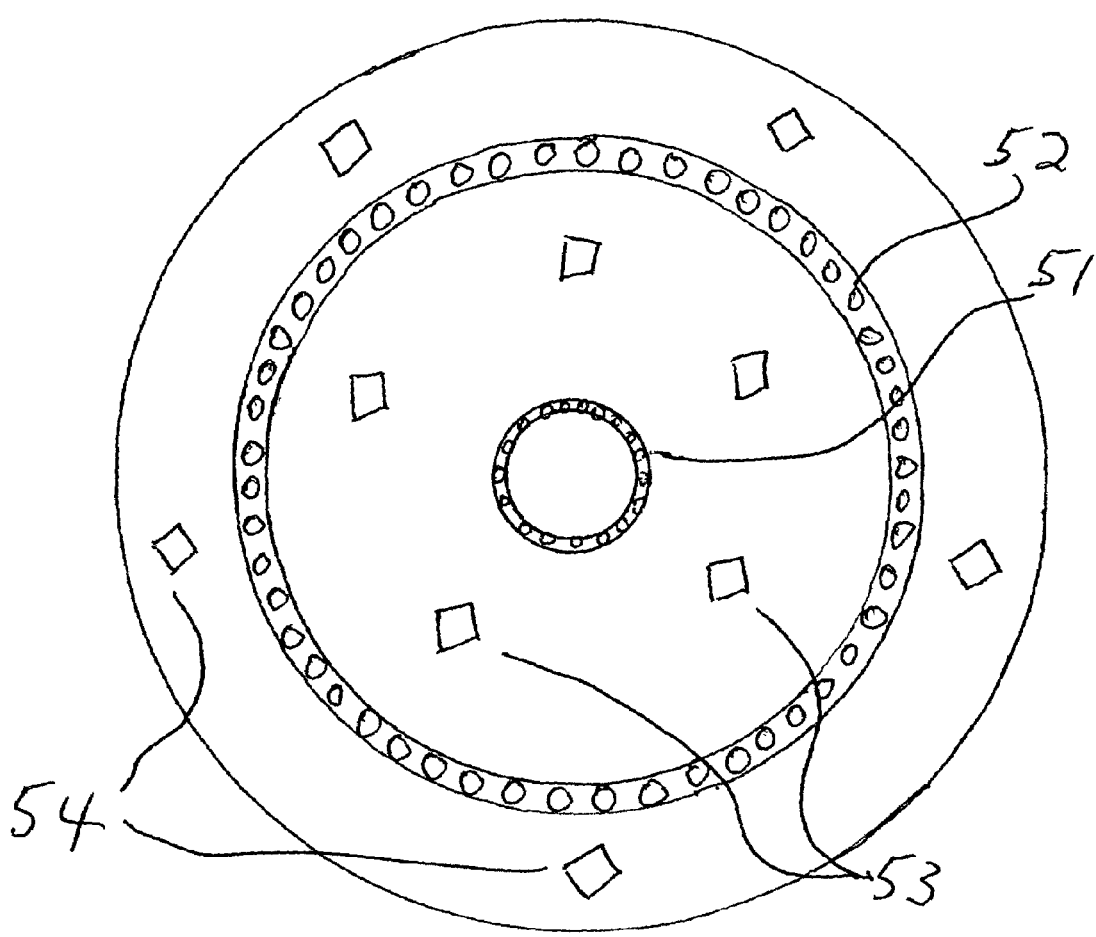
FIG. 5 is an end view of a flange with two bearings and two rows of 5 magnets each.

FIGS. 4 and 5 show representative placements of one or two thrust ball bearings with multiple magnets. FIG. 4 shows location of bearing 41 and magnets 42. FIG. 5 shows location of bearings 51 and 52, which share the load caused by magnets at positions 53 and 54. In one embodiment a magnetic force director such as iron is located at each of position 53 and 54, and pairs of 53 with 54 are coupled together by a cylindrical magnet or paramagnetic material extending from each 53 to a nearby 54. The fields at 53 are all one pole and the fields at 54 are all the opposite pole. For high power embodiments two radial bearings are particularly desirable. In each case, the flange material, thickness, and magnet type (strength) should be chosen so that the magnetic field pull on the flange and extended use does not deform the flange surfaces but maintains a small air gap (average gap typically may be 0.0005 to 0.25 inches, and preferably is between 0.003 to 0.1 inch) between the opposing magnets.

In one embodiment, two shaft ends are constructed having diameters between (in centimeters) 1 to 5, 2 to 10, 3 to 15, 4 to 30, 5 to 25 or even more than 25 centimeters in diameter. Tube, channels, or holes are drilled from the side away from the face to make suitable openings for insertion of magnets, such as samarium cobalt, ferric, or another stronger magnet. Conveniently, two complementary shaft ends are positioned on opposing sides of a low friction bearing, or bearing assembly, and alternately, in turn, magnets are slipped into the opposite sides, which gradually increases attraction between the two sides.

Figure 6:
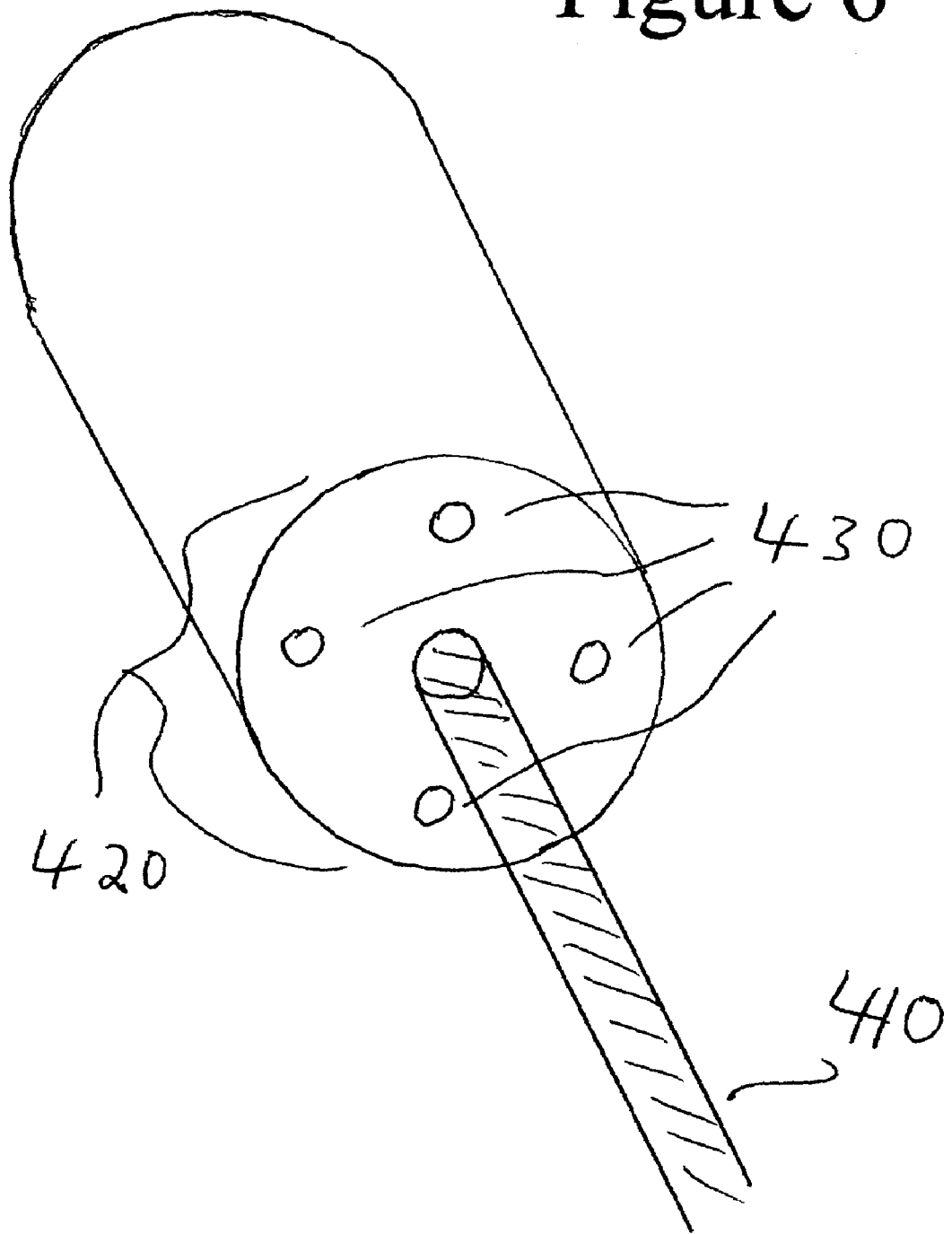
FIG. 6 shows placement of permanent magnets according to an embodiment.
Figure 7:
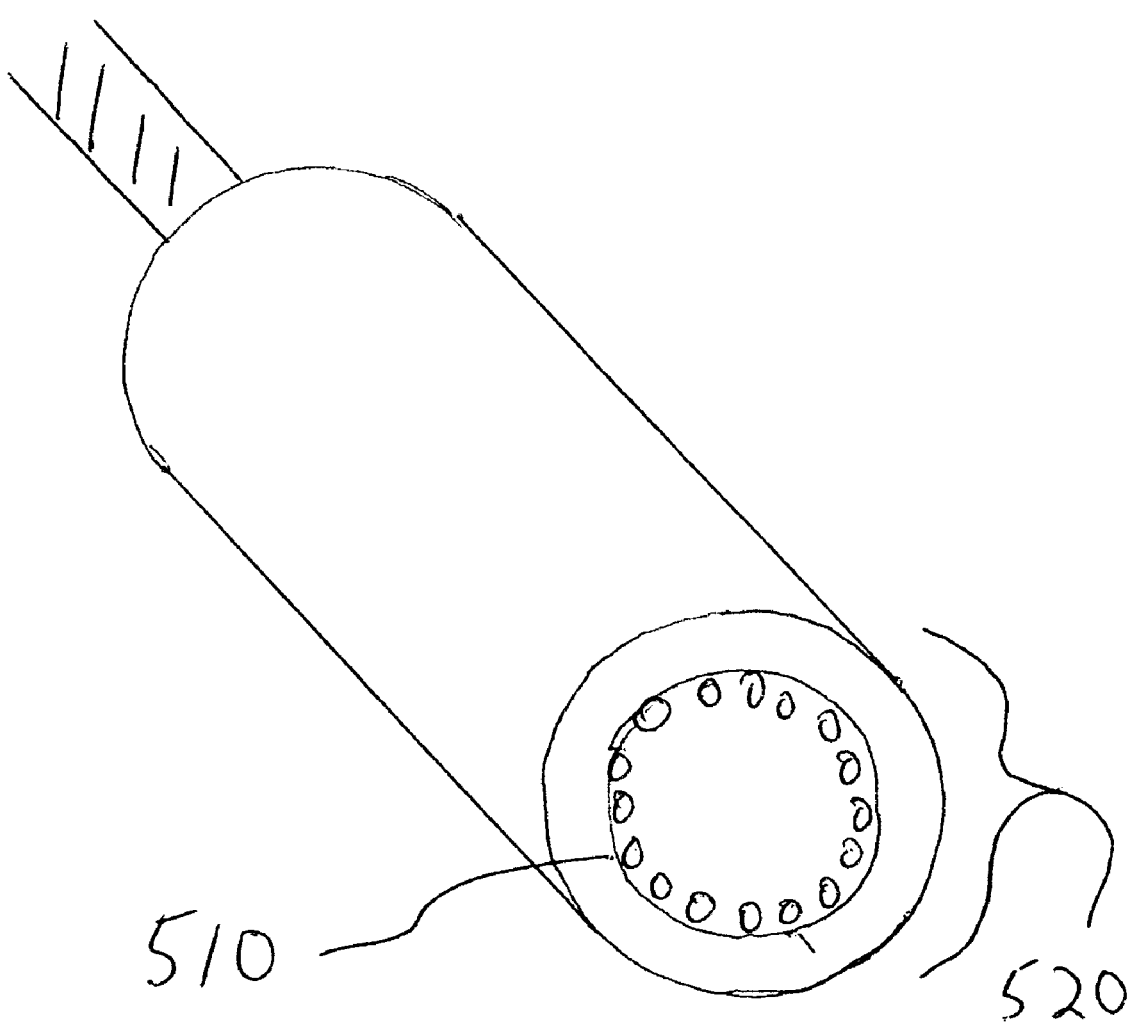
FIG. 7 shows placement of a racetrack ball bearing on one surface according to an embodiment.

When all magnets are in place, a nominal pull is preferred that provides a nominal torque transfer across the junction. Further addition of an electromagnet allows further addition or subtraction to the magnetic pulling force across the junction. FIG. 6 is a perspective view of a representative magnet placement for one shaft end. Shaft 410 is connected to end 420, which is a solid block of metal with drilled out spaces 430 that hold cylindrical magnets. The holes do not extend the entire length of the solid block, to prevent the magnet from pulling out the opposite side due to attraction from a complementary shaft end with magnets of an opposite polarity. FIG. 7 shows a representative race track ball bearing 510 on a flat surface 520.

During use for some embodiments, the upstream (e.g. attached to a drive motor) and downstream (e.g. attached to a driven device such as a propeller or a blade) shafts should be mounted in a fixed position and the downstream shaft further should include a thrust bearing, to accommodate propeller loads and back forces. Other vibration dampening devices and materials may be used to minimize the imposition of motor and propeller forces onto the transmission joint.

In many embodiments a low friction bearing is used to hold the faces of the complementary ends in close proximity to allow magnetic coupling by their magnetic fields. See for example side view of bearing 270 in FIG. 8, and bearing 160 in FIG. 9. The faces may be flat/planar with respect to each other and may consist entirely of flat surfaces that are perpendicular to the axis and with simple bearings as shown in these figures, but also may have very complex shapes with multiple bearings at different locations of contact. However, in other embodiments, the faces are more complicated and may assume ridges on a flat surface, or other structures as may be desired to optimize other parts, such as placement and design of a low friction bearing. In a simple embodiment represented in the figures, the ends are flat and perpendicular with respect to the axis of their shafts and a round race track bearing with multiple balls is attached to one or both facing surfaces. In an embodiment the magnetic fields are arranged with greater force lines towards the center and lower force lines towards the periphery. This allows self alignment of the junction. If one shaft drifts out of center, the stronger magnetic attraction available at the center tends to pull the shaft back into alignment.

Magnets

Magnetic fields used for embodiments of the invention may be created by permanent magnet(s), electro magnet(s) or combinations of permanent magnet(s) and electromagnet(s). For many low cost embodiments one or permanent magnets are particularly desirable and can be made from a variety of materials and in a variety of shapes. For example neodymium iron boron, samarium cobalt, alnico, ceramic, and/or ferrite are suitable for permanent magnets. Magnets may be physically inserted into a device. In many embodiments magnets are inserted into rotating parts, by screwing, placing into holes, bolting, gluing, or the like. In a desirable embodiment a powered composition of rare earth magnetizable material such as neodymium ion boron is mixed with an organic material that polymerizes into a solid and the solid may be screwed in or otherwise mounted on a device as described herein. In another embodiment an entire part of a device, such as a rotating surface comprises magnetic material.

In some embodiments a paramagnetic material such as iron is used to direct the magnetic lines of force from one or more permanent magnets. This is particularly helpful when the individual magnetic fields of separate magnets are to interact, preferably by attracting, with magnetic field(s) of magnet(s) attached to the opposite axle. In was found that localizing magnetic fields form magnets associated with each axle allowed greater torque transfer between the axles. Without wishing to be bound by any one theory for this embodiment of the invention it is thought that when the magnetic fields of multiple magnets associated with one axle merge to act as one large magnet across a greater surface area perpendicular to the axis of rotation, an opposite attractive magnetic force that moves over that same area does not experience any position dependent attraction. On the other hand, when a localized magnetic north pole moves across the individual fields of several localized magnetic south poles, each interaction represents a separate attractive tug, which increases the attractive force experienced during rotation.

Electromagnets may be constructed using a variety of materials and techniques as are known in the art. Preferably, one or more electromagnets, if used, are fixed in location and not supplied electric power through a moving part such as a brush or ring assembly. Electromagnet(s) may be fed a variety of electric signals for pulsing, stopping and other activities. An electromagnet may create a field that joins the field of a permanent magnet, and thereby modulate the magnetic field across the junction.

Bearings

A variety of bearings may be used to alleviate friction between the ends of the axles. For example, ball bearings constructed of steel, silicon nitride, ceramic, or other material may be used within channels, or other spaces as are known to skilled artisans. Most preferred are thrust bearings comprised of round retainers that hold balls, and having hardened washers on each side. To improve wear and minimize the effect of magnetic fields on the bearing, ceramic balls are particularly useful. Nylon or phenolic retainers also are desirable. Most washers in this type of application are hardened steel or stainless steel and would be sensitive to strong enough magnetic fields. A non-paramagnetic material (such as a plastic washer) may be inserted between the washer and the flange body to minimize the effect, if desired. Regular ball circle/washer assemblies are preferred over banded thrust bearings due to their greater ability to absorb thrust stresses. Bearings may be used, for example in flat race, angled, flat-seat thrust ball, grooved race, double acting, self aligning configurations. Roller bearings may be very useful for instances where high radial loads are experienced. Thrust ball bearing assemblies may be obtained from a variety of source, such as Scheerer Bearing Corp. (Horsham, Pa.) or The Barden Corporation (Danbury, Conn.) the latter of which offers excellent literature that teaches how to select and use a suitable bearing.

The friction from two or more flange surfaces may be alleviated by the use of Teflon or other slippery material as an intermediate substance between the surfaces. A good material is high molecular weight polyethylene, particularly cross linked by radiation to harden the surface and improve wear properties. The use of a simple layer of slippery material is particularly useful for low cost rapid acting clutch embodiments, where the surfaces slide past each other only for very short times, and a change in torque created by constant differential rotation of the two axles is not employed. That is, for rapid clutch activation whereby disengagement occurs very infrequently such as in an electronic propeller guard, a simple low friction surface may suffice.

An angular contact thrust ball bearing or cylindrical roller bearing assembly is particularly desirable for contacting opposing flange surfaces that are not perpendicular to the rotation axis. Angular contact thrust ball bearings allow, for example, the use of conical flanges, which can be self aligning, and allow more play in the alignment of the two axes.

A center pilot shank optionally may be used to keep the opposing flanges aligned on the same rotation axis. The shank may be for example a stainless steel pin that is inserted into a hold or sleeve or other tube, in the center of rotation axis of both flanges. A bearing such as a sleeve bearing or roller bearing may be used to minimize friction of the shank. Use of a pilot shank is particularly useful because the magnetic force that holds a double flange assembly together can vary and a negative thrust might exceed the attractive forces, which, even momentarily, may pull the flanges apart. For example, when used within a boat propulsion system a device as described herein may be suddenly reversed for reverse propeller thrust. In such case, the downstream axle towards the propeller may exert a pull on the device, which would counteract magnetic forces holding the double flange assembly together. Having a center pin at the rotational axis will allow some variation in air gap between the flanges without losing the center positioning of the flanges. In this embodiment, when using a circular thrust bearing it is helpful to have commensurate tension in the bearing assembly to allow this movement without damaging the bearing. A polymeric, rubber or other compressible material may be sandwiched between thrust bearing washers and the adjacent flange surfaces to accommodate this.

Magnet Orientation and Placement

Magnets may be placed and oriented in a variety of positions depending on the use. An axial connector, which has fixed magnetic fields from permanent magnets provides a nominal mechanical coupling that may be modulated by an electromagnetic clutch, or a variable speed reduction for a given torque and generally is not electrically adjustable. A torque converter, as on the other hand as termed herein, comprises a continuously adjustable torque transfer and may have one or more electromagnets that generate magnetic fields that influence the magnetic field(s) of rotating magnets to alter the transfer of rotational power.

In one embodiment a flange surface comprises a magnetic material throughout, which presents a single large magnetic field that extends throughout the entire surface. This material may be for example, particles of rare earth magnetic material in a polymer matrix, or the material may be a magnetic ceramic formed in the shape of the flange surface. In another embodiment one or more permanent magnets are mounted in a paramagnetic material that makes up the flange surface and which delocalizes the magnetic lines of force throughout the entire surface. In yet another embodiment magnets are present on only one of the two flanges and paramagnetic material such as iron is present without any magnets in the second flange. The north-south orientation of the magnetic field that emerges from the flange surface made thereby may be parallel to the rotation axis but most preferably is at least partly away from the parallel by at least 5, 10, 15, 20, 30, 45 or even 60 degrees of angle. In an embodiment the magnetic fields are oriented away from the rotation axis vector and at least partially along the vector (ie. not entirely perpendicular to) of the direction of rotation. This is because, for that embodiment, the torque transfer is much greater if the magnet pulls in the direction of movement. Accordingly a most preferred embodiment utilizes magnetic fields that contribute at least some pull in the desired direction. In some embodiments it is desirable to have the magnetic fields pull the two flanges together and in an embodiment the field is oriented in between to allow pulling of the flanges together while partially pulling in the direction of movement.

In many embodiments the magnet(s) are oriented so that one pole is directed to the opposite flange across the air gap. A shaped piece of paramagnetic material such as iron may be used in contact with or proximity to a magnet to direct the lines of force from a pole across the junction. However, in a particularly desirable embodiment both fields of a magnet are directed across the flange junction, either by shaping the magnet accordingly (e.g. by making the magnet in a horseshoe shape with the ends facing the junction) or by using paramagnetic forc directors. As described above for FIG. 5, magnets may be inserted into positions between north pole directors and south pole directors. The directors exert both south and north pole fields away from (i.e. perpendicular to) the flange surface.

Figure 10:
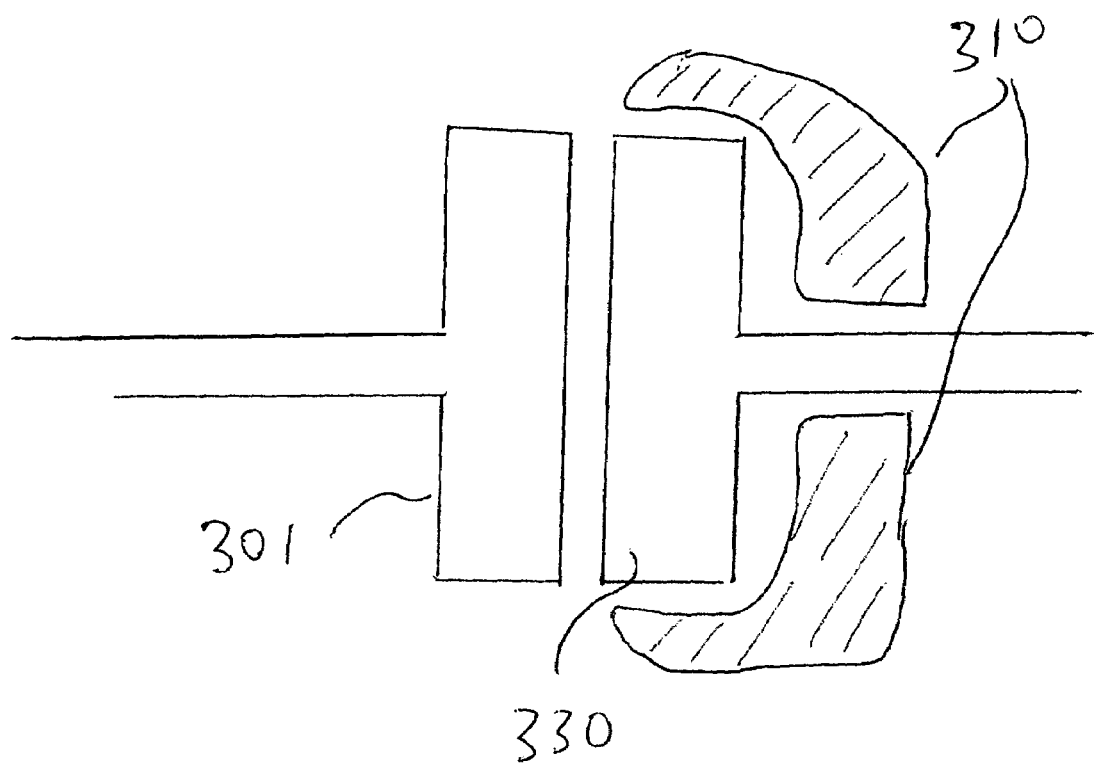
FIG. 10 shows placement of an electromagnet according to an embodiment.

In an embodiment multiple magnets (or their fields) are used and, for a given flange, are equally spaced towards the periphery of a flange to evenly distribute their mass and attractive forces to minimize vibration. FIG. 10 shows in side view, two thick two flanges 301 and 330, which are used together, that have 8 magnets and 9 magnets respectively (not shown). As the flanges rotate at different speeds, there are 8 positions along a 360 degree rotation wherein the pull between flanges is maximum. In an embodiment, electromagnet 310 nearby is oriented and energized with a pattern of electrical pulses to minimize the 8 pulses per rotation between the two flanges to minimize vibration. In yet another embodiment, one or more magnetic field detectors such as a hall device are positioned nearby and sense the difference in rotation rate, thus inferring information about the change in rotation rate between one axle rpm and the other axle rpm.

In an embodiment a magnetic force attraction desirably is maintained between opposing flanges. For this reason, magnetic opposing force generally should exist at multiple equidistant or mostly equidistant locations of a flange at all times. One way to achieve this is to have magnetic force in the center of the flange, perhaps inside the bore area of a round thrust bearing, if used. Another way is to make the entire flange at least partly magnetic and create attraction throughout the surface area at all times. In this case, additional points of high magnetic attraction at extreme periphery of the flange is desirable to obtain greater torque transfer. Yet another way is to use both poles of a magnet so that the north pole fields are directed at equally spaced points at one distance from the axis of rotation and the south pole fields are directed at equally spaced points at a second distance from the axis of rotation so that when the attraction between opposing fields for one concentric line of fields is at its maximum the attraction between opposing fields for the second concentric line of fields is at its minimum, and vice versa. In one embodiment an inner band, comprising a single magnet or individual magnets is arranged in a ring around the center axis of the flange.

In an embodiment, magnets are arranged on opposing surfaces of both flanges so that their magnetic fields pull each other. In this case, the magnets on one flange may not all line up (opposing magnets all opposite each other) at one position during rotation. Such synchronous operation is desirable where a discrete torque shift is desired. For example, if 4 magnets are used on both sides at four equidistant locations, then at times of very low resistance to the output shaft rotation, the two flanges will rotate together and the rpm ratio of both shafts will be 1. When a threshold resistance is exceeded, the partnered magnets will uncouple, and the downstream flange will rotate more slowly, and generally receive much less power. In many situations, particularly for watercraft, this torque shift is not very ideal, and asynchronous operation is preferred. The term "asynchronous," as used herein, means that the magnets on the upstream (motor driven) flange do not match up exactly with the magnets on the downstream (power absorbing) flange. Instead, there is always one or more magnets that is not maximally opposing a magnet, with maximum magnetic attraction at any given time.

One way to achieve asynchronous operation is to have different numbers of evenly spaced magnets on each flange. For example, one flange may have 5 magnets at 6 inches, away from the rotation axis and the other flange may have 7 magnets at 6 inches away form the rotation axis. All five magnets of the first flange are not perfectly positioned opposite five magnets on the other flange at any time. A particularly desirable asynchronous arrangement is to have two or more concentric rows (a row is a set of magnets at the same distance from the rotation axis) on both flanges such that when a first row of magnets line up with the opposing row from the other flange, the second row of magnets do not line up. If both flanges have the same number of magnets positioned the same way in two such rows, a partly double synchronous operation may result such that transfer of power, as seen by a rpm vs horsepower curve, tends to have two plateaus. The same phenomenon can be obtained for three or more rows as well. This is desirable for some embodiments where two different (or more) set torques are desired, without having to use control circuits for electromagnetic fields to adjust torque.

A skilled artisan can design combinations of magnets that yield different kinds of asynchronous operation and further details are not provided due to space limitations. For driving, for example, saw blades or propellers on watercraft however, a fairly asynchronous operation often is desired. Of course, one or more electromagnets can be pulsed so that their field(s) counter the tendency towards asynchronous operation, as well as establish desired patterns of synchronous operation. In doing so, it is helpful to detect rpm of both shafts in real time, and to have a control circuit and/or software analyze the parameters and control the electromagnet(s) accordingly.

In a preferred embodiment that provides lower cost one flange contains permanent magnets and the other contains a continuous large surface of magnetically responsive material that is not magnetized, around a rotating axis. Each permanent magnet exerts a constant magnetic pull on the magnetically responsive material because as the flanges rotate, a constant amount of magnetically responsive material exists in close proximity to the permanent magnet. In a simple embodiment according to this scheme the magnetically responsive material is a circular steel plate that rotates around the center of the plate and has an axle at the center.

Torque Conversion: a Representative System

Figure 9:
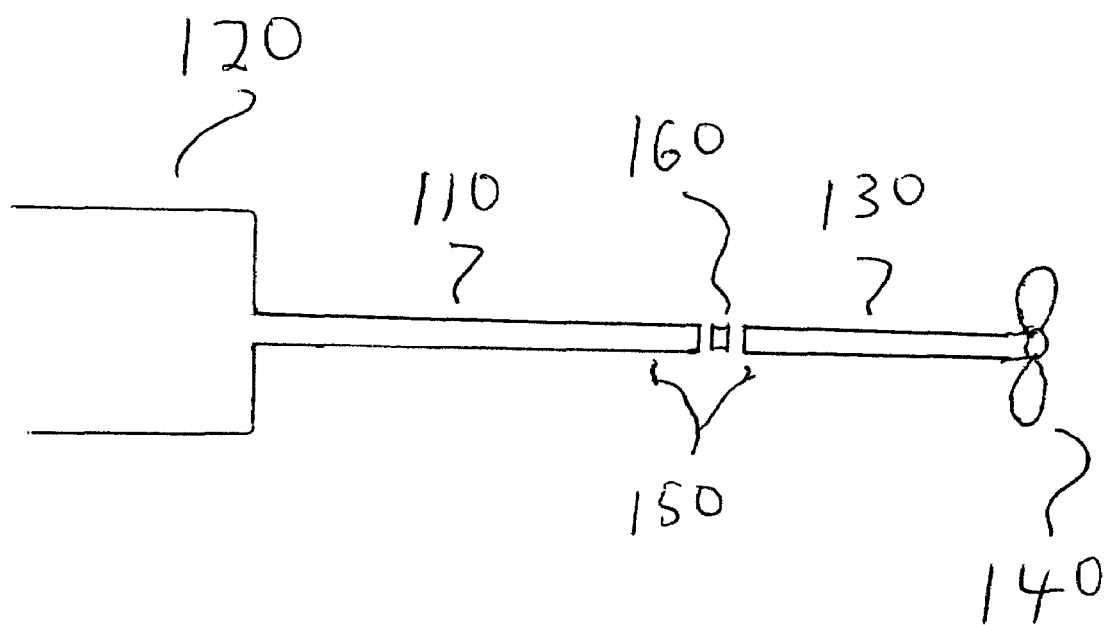
FIG. 9 shows an embodiment that links a driven propeller to a motor.

One representative system, as shown in FIG. 9, includes upstream shaft 110 attached at one end to motor 120. The other end of shaft 110 is magnetically coupled to shaft 130 via coupler 150. Shaft 130 has attached a driven device such as propeller 140 as shown here. This figure does not show magnets but includes ball bearing 160 which keeps the metal surfaces of the two shafts from grinding on each other. The system may be in any possible orientation and generally can be used with a wide variety of motors and driven devices.

Figure 8:
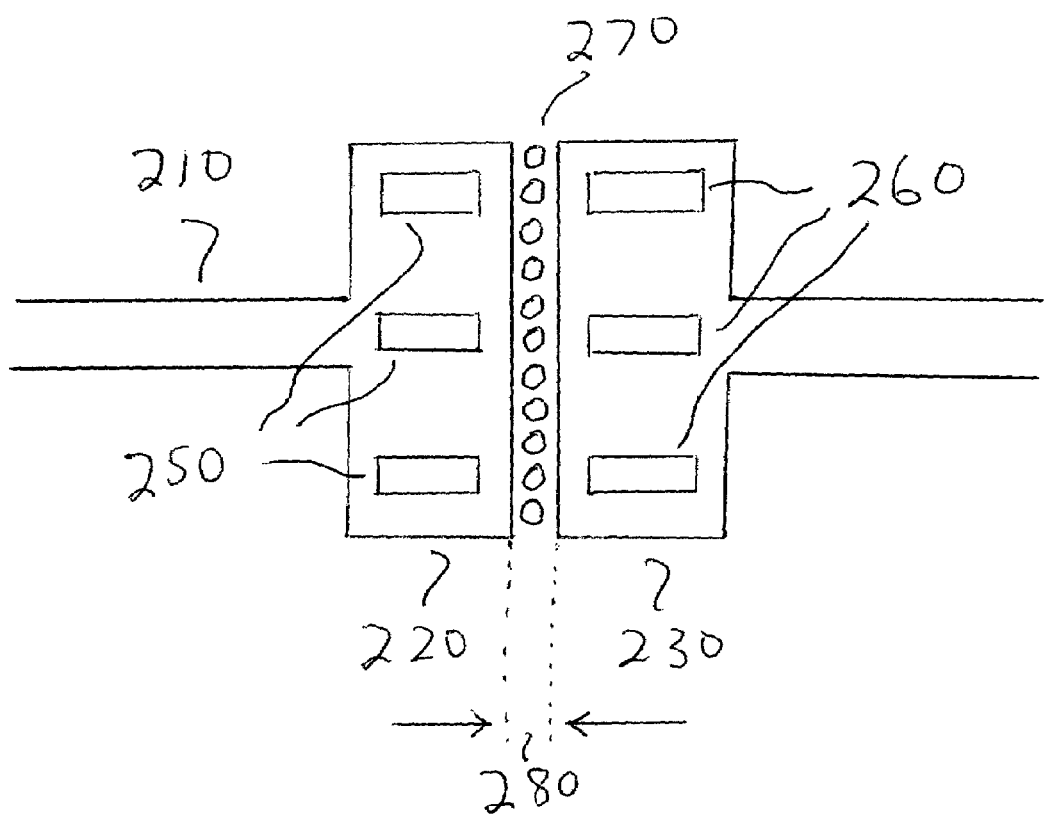
FIG. 8 shows more detail for the junction of a magnetic transmission.

FIG. 8 shows more detail of a representative coupler. This side view shows upstream (towards the motor) shaft 210 having an end 220 that faces a complementary end 230 of downstream (towards the driven device) shaft 240. Ends 220 and 230 in this example contain embedded permanent magnets. Three magnets 250 are shown within end 220 and three magnets 260 are shown within end 230. In this example each set (within one end) of magnets are oriented with the same polarity, and the opposing sets are oriented with opposing polarities, which magnetically pulls the two ends together. A ball bearing between the faces of the two ends are kept apart through a small distance by a mechanism that may be, for example, bearings, such as ball bearings, bearings with a spring or other expansive device that pushes the faces apart, bearings elsewhere on the the shafts, and/or combinations of these. FIG. 8 shows ball bearings 270 (which normally are mostly within a groove shared between the two flange surfaces) and the distance between the faces is made overly large for purposes of illustration.

Continuously Variable Torque Conversion System

The magnetic coupling between upstream and downstream shafts may be modulated by one or more of a wide variety of techniques and contrivances. One method is to vary the spacing between the two faces, because magnetic field strength is inversely proportional to a factor (such as the cube) of the distance. A spring, piston, compressed fluid or other arrangement can be made to modify this distance, as will be appreciated by a skilled mechanical engineer with routine optimization. Another method is to modify the placement or permeability of magnetic field radially away from (or to) the axis of rotation. For example, a magnet, or its lines of force, may be moved further away from the rotational axis. If this is done for magnetic fields (and/or magnets) on both sides of the junction, then torque transfer may be increased, with concomitant alteration in rpm ratio. Another method is to modify the placement or permeability of magnetic field along the axis (closer to and/or further from the junction). By moving one or more magnets (and/or its field) closer to the junction a greater torque transfer will be possible. In a desirable embodiment, the centripetal force associated with higher rotations pulls magnets, or magnetic field directors in a manner that decreases the magnetic attraction across the junction between flanges and effectively increases the rpm change, while increasing output torque at the downstream shaft. This is particularly desirable for use in watercraft, because the coupling (inverse of effective gear ratio) ideally becomes lower as the watercraft increases speed and the motor rpm increases.

Introduction of Electromagnet Control Field

A highly desirable way to modulate torque transfer is to include a (preferably fixed, non moving) electromagnet that can add to and/or subtract from one or more magnetic fields. FIG. 10 illustrates in side view, one such embodiment where a single coil, shown as two lobes 310 are wrapped around downstream complementary end 330. The electromagnet may comprise one, two, three or many more separately controlled coils and may envelope the upstream side, downstream side, or both sides. An advantage of the downstream coil 310 shown in FIG. 10 is that in addition to decreasing coupling of the propeller shaft from the motor shaft, this coil (or a portion of it) can be energized in a manner to allow electromagnetic braking of the propeller shaft, by interacting with permanent magnet(s) in the downstream shaft.

Figure 11:
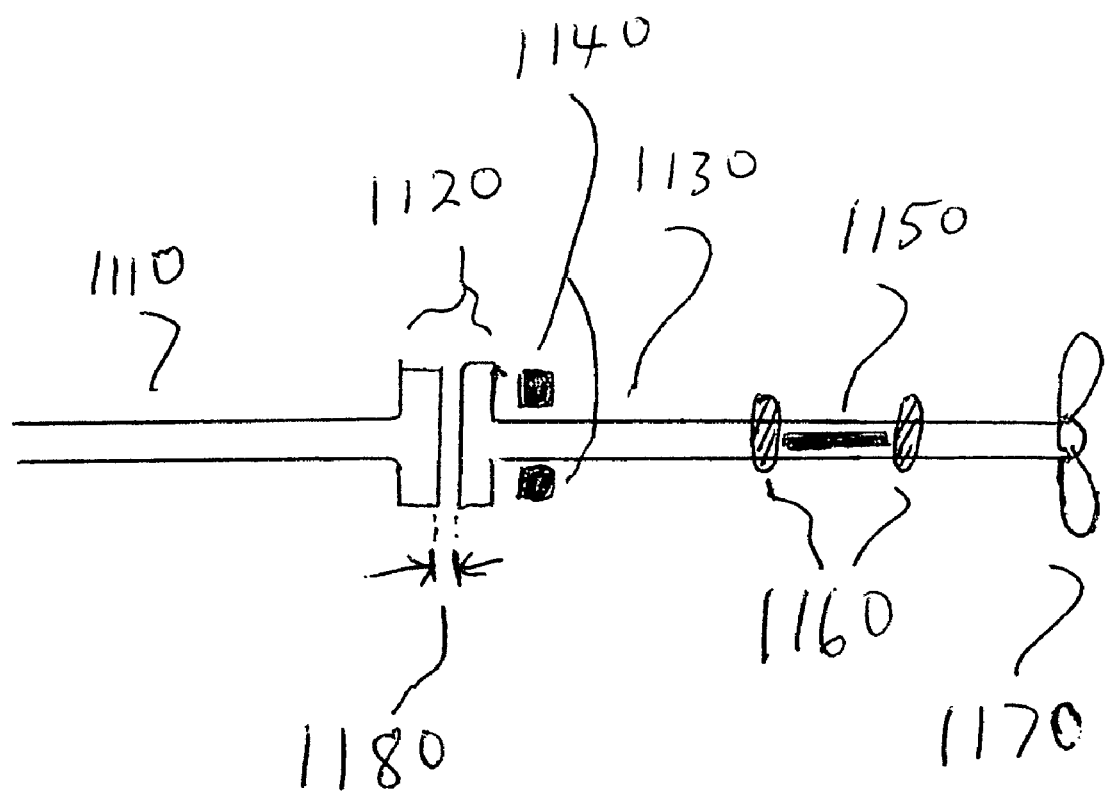
FIG. 11 shows placement of shaft coupled magnets and their controlling electromagnets according to an embodiment.

In yet another desirable embodiment, one or more preferably two electromagnet coils surrounding a moving shaft are located adjacent to one or more permanent magnets attached to a shaft, as for example, diagrammed in FIG. 11. Here, upstream shaft 1110 is attached via optional magnetic torque converter 1120 to downstream shaft 1130 and propeller 1170. Immobile stops 1140 prevent excessive disengagement of the two flanges that make up torque converter 1120. Immobile stops may be for example a fixed bearing or a Teflon™ surface that prevents downstream shaft 1130 from moving too far to the right. One of the permanent magnets attached to the downstream shaft 1130 is shown as dark filled rectangle 1150. Electromagnet coils 1160 are located adjacent to and both upstream and downstream to magnets 1150. Coils 1160 are fixed and wound around a plastic sleeve on shaft 1130. Coils 1160 are located at a position to impart maximum force onto magnets 1150 upon application of electric current.

Preferably during operation, the right hand coil 1160 creates a magnetic field that is opposite to the right hand side field of magnet 1150 and the left hand coil of 1160 creates a magnetic field that is the same polarity as the left hand side field of magnet 1150. During operation both electromagnets 1160 preferably are energized together. The left electromagnet of this pair pushes magnet 1150 and thus shaft 1130 to the right. The right electromagnet of this pair pulls magnet 1150 and thus shaft 1130 to the right. In response, gap 1180 within torque converter 1120 becomes larger and the right side of 1120 may move to touch immobile stops 1140. In another embodiment activation of electromagnets 1160 modulate the torque transfer at 1120. A spring held mechanism for 1120 may be used. For example, a spring or other tensioning device may exist between the right side of 1120 and stops 1140. In yet another embodiment a further electromagnet, (or a portion of electromagnet 1160) is oriented close to the lateral surface above 1150 and acts further as a brake of angular momentum. In another embodiment an electromagnet such as electromagnet acts as an electricity generator and in yet another embodiment the electromagnet is used as a starter motor for an internal combustion engine. A skilled artisan after reading this specification and the drawings will appreciate yet further alterations, and space limitations preclude listing all such possible embodiments.

In another embodiment a paramagnetic axle attached to a paramagnetic flange has an electromagnet that affects the flange magnetic field. An example of this is a flat steel flange with an attached steel axle. Covering the axle near the flange is a sleeve (such as a plastic or aluminum tube, preferably with wall diameter less than 0.25 inch), optionally with lubricant, that allows rotation of the flange/shaft without rotation of the sleeve. An electromagnet of wound wire is located around the sleeve. By impressing an electric current through the wire, the axle under the sleeve becomes magnetized, and transfers the magnetic field to the flange. Other materials and methods for modifying the magnetic field(s) at the flange surfaces will be appreciated by a skilled artisan based on these examples.

Fast Acting Clutch System

An electromagnetic field used in torque transfer is particularly desirable for devices and systems that rapidly disconnect a propeller or other device from the motor. In an embodiment, preferably a suitable electric current of sufficient magnitude and polarity is switched or modulated onto one or more electromagnets so as to diminish the magnetic field(s) on one or both sides of one or more permanent magnets. In a desirable embodiment, the combined (merged) magnetic field from a permanent magnet measured at the surface of the opposing rotor is decreased by at least 20%, 30%, 40%, 50%, 60%, 70%, 80%, 90%, 95%, 97%, 99% or even more by action of a nearby electromagnet that is switched for this purpose. The electromagnet may be affixed to and rotate with one of the flanges, in which case electrical power must be supplied, for example, by slip rings, or brushes. More preferably the electromagnet is fixed and does not rotate. The "electromagnet" may comprise more than one coil of electromagnets that may be independently excited.

The action of pulsed electromagnets, according to an embodiment can significantly slow (decrease speed 90%) or even stop a shaft such as a propeller drive shaft within 1 second, 750 milliseconds, 600 milliseconds, 500 milliseconds, 400 milliseconds, 300 milliseconds, 250 milliseconds, 200 milliseconds, 150 milliseconds, 125 milliseconds, 100 milliseconds, 85 milliseconds, 75 milliseconds, 60 milliseconds, 50 milliseconds, 40 milliseconds, 35 milliseconds, 30 milliseconds, 25 milliseconds, or even 20 milliseconds. In a most desirable embodiment, two or more capacitor stored charges are discharged via a semiconductor switch such as a transistor or silicon controlled rectifier at two or more different time constants into one or more electromagnets simultaneously. Desirably the voltage of one capacitor stored charge circuit decays to one half its initial value within less than 50 milliseconds and the voltage of another capacitor stored charge circuit decays to one half its initial value after more than 50 milliseconds. The two or more discharged pulses allow both rapid acting and longer acting charges to develop a very fast magnetic field in less than 50 milliseconds, but also a longer time duration field of more than 50 milliseconds.

In another embodiment a magnetic field from one or more electromagnets acts to brake the downstream axle rotation. The electromagnet may have a dual purpose for both adjusting torque transfer through the junction and braking, or may be a separate electromagnet dedicated to braking. The electromagnet may still further serve as an electric generator, a starting motor or both. The braking action may arise from interaction between the electromagnet (attractive/repulsive, or both) and the permanent magnets in the flange or between the electromagnet and one or more permanent magnets elsewhere, such as on the axle connected to the propeller.

In this embodiment power from one or more electromagnets rapidly stop a spinning axle. One or more pulses of power energize electromagnets that pull on permanent magnets that are connected to one or more spinning axles. The permanent magnets in an embodiment do not participate in torque transfer between two face plates but are separate and connected to an axle. For example, two or more magnets may be imbedded to or attached to the surface of an axle, and may surround the axle arranged like staves of a barrel around the axis. One or more electromagnets, preferably just outside the ends (perpendicular to the rotation) are fixed and exert a force upon the axle magnets. Such fast acting electromagnetically controlled magnetic coupler is very useful for rapidly stopping an axle rotation and is preferred to implement an electronic propeller guard.

In a desirable embodiment, the two shafts are coupled synchronously such that their magnets are locked in place with respect to each other. A large electromagnetic pulse asserted into one or more electromagnets arranged near the flange magnets and/or near the axle magnet(s) at least momentarily decouples the two axles or pulls them apart by asserting a magnetic field against one or more permanent magnet fields. This allows at least a momentary decoupling and subsequent rotation of the drive shaft with respect to the driven shaft, for at least part of one revolution. When pulsed, the two face plates begin to rotate independently of each other. One or more further pulses may be asserted for continued decoupling. For example, a large electric pulse that decays with a half life of 100 milliseconds may be imposed on the electromagnet(s) at the same time as another large pulse that decays with a half life of 20 milliseconds, in order to obtain both rapid initiation and more prolonged pulses. Still further, a steady (but lower current) DC voltage advantageously may be applied.

Preferably, the electric pulses arise from a silicon controlled rectifier controlled discharge from a capacitor. Firing the silicon controlled rectifier allows very rapid discharge of a very high amount of electricity through the electromagnet, which can a) decouples the opposing discs for a short time; b) pull the opposing discs apart via interaction on shaft magnet(s); or both a) and b). In an embodiment the surfaces move apart from each other. In a desirable embodiment, a bearing may be added to the other side of one or both surfaces, to keep them from separating too far from each other. Of course, other mechanical stops may be employed as will be appreciated by a skilled machinist.

While the magnetic field coupling weakens, the drive motor preferably starts to shut off. For example, when used with an internal combustion engine drive, sparks may be interrupted and fuel flow may stop. In an embodiment wherein the shafts are coupled via permanent magnets, the shaft uncoupling from the initial pulse(s) may last no more than a single revolution because the permanent magnets align themselves in position with each other again after 360 degrees (if one facing magnet), or 180 degrees (if two facing magnets as preferred) or even less rotation. In some cases, the rotation time is slow enough to allow shut off of the drive motor and the system stops during this short time. However, in an embodiment wherein the shafts have been rotating quickly, the electromagnet(s) may be pulsed again to alleviate the magnetic coupling between shafts for another time period. Optionally, a brake on either or both shafts may activate. In a preferred embodiment rapid pulse(s) to an electromagnet decouple the shafts momentarily to allow time for slow acting braking systems, such as friction brakes, and simple motor shut off, to operate.

This kind of electromagnet brake can be used on either or both sides of the coupling, and is most preferred on the driven (e.g. propeller or other driven device) side. In an embodiment the same electromagnet(s) that decouple the two sides of the magnetic coupler also assert a braking effect on the driven side shaft via magnetic interaction with magnets on that shaft. One side of a decoupling electromagnet is near magnets on the driven side and the other side of an electromagnet is near magnets on the propeller side shaft. In a desirable embodiment the braking occurs by interaction of fixed electromagnets driven by a rapidly discharging capacitor (controlled by a transistor, IGPT transistor, SCR or the like) and the electromagnets may act directly on a shaft by pulling and/or pushing shaft permanent magnets in a direction along the shaft axis.

A most rapid and powerful electromagnet braking circuit is preferred. In order to achieve rapid uncoupling, a very rapid pulse is preferred. Maximum (instantaneous measurement) current flows preferably in less than 250 ms (milliseconds), less than 125 ms, less than 75 ms, less than 50 ms, less than 35 ms, less than 25 ms, less than 10 ms, less than 6 ms or even less than 3 ms. A major limitation with electromagnets is the amount of power that can be absorbed without overheating the wire. In a preferred embodiment, a super high power is pulsed, which exceeds the allowable steady state power dissipation of the electromagnet coil by at least 10 fold, 100 fold, 1000 fold or even at least 10,000 fold. Preferably, a large capacitor of at least 1000 microfarads, 10,000 microfarads, 25,000 microfarads, 50,000 microfarads, 100,000 microfarads, 250,000 microfarads or more at high voltage (at least 25, 50, 100, 200, 300, 500 volts or more) is kept charged up and then discharged into the electromagnet when a stop is called for. In another embodiment a low voltage (less than 12, 10, 6, 4, or even less than 2 volts) capacitor of high capacity (at least 1, 5, 10, 25, 50 farads or more) is used. High power versions of electronic flash circuits commonly used for flash photography are particularly desirable for energizing a coil.

The permanent magnets against which the electromagnetic field(s) interact to slow/stop an axle also are limited to the amount of impressed magnetic field that they can tolerate before becoming permanently demagnetized. Desirably, the amount and duration of impressed magnetic field from an electromagnet is smaller than that which can demagnetize a permanent magnet by 5% after 100 electromagnetic pulse events, more preferably less than that which can demagnetize the permanent magnet by 1% after 1000 pulse events, and even more preferably less than that which can demagnetize the permanent magnet by 0.1% after 1000 pulse events.

In a particularly desirable embodiment extremely high electromagnetic fields from a pulsed circuit are impressed onto one or more permanent magnets attached to a shaft and aligned with their north and south poles arranged parallel to the axis of rotation. The permanent magnet(s) optionally are reversibly attached such that pulling or pushing them up or down along the length rotation axis will result in a force on the shaft. By allowing their removal, the magnets can be replaced with fresh magnets after destruction of some of their magnetism by repeated use. This embodiment allows stronger electromagnet pulsing than otherwise can be used.

By pulsing for only a short time heating is minimized. Preferably, inductance is kept low to allow a high electromagnet current with short delay times, as for example described by RLC simulations presented at http://www.oz-.net/~coilgun/mark2/ricsim.htm. In an embodiment, either the same coil or another coil additionally is separately excited with a longer pulse time, to provide a longer duration decoupling. For example, a 20 millisecond pulse (90% of the total energy expended within 20 milliseconds) may be asserted for rapid action, but another 200 millisecond pulse having a long rise time is also used. By combining both a fast acting but very short pulse with a slow acting but longer pulse, both rapid decoupling and longer decoupling may be achieved. A desirable way to implement this embodiment is to connect one or more silicon controlled rectifiers (SCRs) with charged capacitor(s) with a blocking diode. Each SCR can be triggered together, particularly if their circuits have differing time constants, or separately to obtain both a faster acting pulse (lower inductance, lower resistance) and a longer acting pulse (higher inductance, resistance).

Another embodiment provides a system comprising a capacitor, capacitor charging circuit that can be as simple as a continuous connection to a power supply, an electromagnet, and a solid state switch such as a MOSFET, an IGPT or SCR that connects the capacitor to the electromagnet upon triggering. In the case of the electronic propeller guard embodiment, triggering may arise from a sensor that detects an object near the propeller. Of course, multiple capacitors, solid state switches, and electromagnets may be used in combination. Another embodiment is a container that includes the capacitor and solid state trigger, connected to an axle decoupling electromagnet as for example described herein. Yet another embodiment is a power axle decoupler comprising one or magnets that couple one axle rotation to another and a stored charge trigger device that dumps stored charge into an electromagnet to at least partially uncouple the two axles. The term "power" in this context means at least 0.1 horsepower, 0.25 horsepower, 0.5 horsepower, 1 horsepower, preferably at least 3, 5, 10, 25, 50, 100, 200, 500, 1000 horsepower or more.

The rapid pulsed electromagnet brake described here also may be used independently without an axial connector or torque converter. For example, the brake may be used on a downstream shaft connected to an electric motor, and can help the motor stop by asserting magnet field(s) perpendicular to the shaft rotation axis in a manner that opposes permanent magnets attached to the shaft. In yet another embodiment, a motor is connected to a propeller via a shaft that can twist around the axis of rotation. The pulsed electromagnet rapidly stops the propeller while the motor stops more slowly, and induces a torsional stress in the flexible shaft.

Although the above description focuses on rapid stopping of propellers, the same materials and methods are intended for use in other systems as well, such as farm machinery, other industrial machinery, other vehicles and the like. Other permutations of embodiments will be appreciated by a reading of the specification and are within the scope of the attached claims.

EXAMPLE 1

This example demonstrates a typical arrangement wherein multiple permanent magnets are placed at close mutual proximity but on opposite faces of two flat flanges that are connected through a ball bearing. The bearing is a 3 inch bore 4 inch outer diameter ball bearing assembly from Scheerer Bearing Corp. of Horsham, Pa. (catalog No. XW3). The bearing is located in grooves approximately ⅜ths inch thick at the center of two 8 inch diameter ¾ inch thick aluminum plates. Each plate is connected in its center to a 0.75 inch spindle 6 inches long. Near the periphery of each aluminum plate, on the side with the attached spindle, 6 rectangular indentations one inch square and ⅝ inch thick equally spaced around the plate and starting ¼ inch from the outer edge are made. Each indentation is designed to hold a 0.5 inch thick one inch by one inch neodymium boron magnet that will be set with glue. The magnets are 0.5 inch by 1 inch by 1 inch item number NB006N-35 obtained from All Magnetics, Inc. (Anaheim Calif.). The face plates are placed with their flat sides together and spindles out, with the bearing assembly sandwiched between them. Then, a magnet is glued to the outside surface of one face plate with the north pole facing down. A magnet is glued to the backside of the opposite surface face plate with the south pole facing down such that the two magnets attract each other. Then, 180 degrees away on the discs, magnets are similarly added. This is continued until all magnets have been added and the two flat faces are held together by strong magnetic fields. The spindles are mounted in roller bearings in a frame to maintain their position while allowing rotation.

An electric motor of approximately one horsepower is connected to one spindle and a propeller in a tank of water is connect to the other spindle through a shaft. Power is applied at a low level and the propeller turns at the same rpm is as the motor. As the power is increased to the motor, the propeller speed progressively becomes lower than the motor speed.

EXAMPLE 2

In this torque converter example, multiple permanent magnets were placed at close mutual proximity but on opposite faces of two flat flanges that are connected through a ball bearing. The bearing is a 3 inch bore 4 inch outer diameter ball bearing assembly from Scheerer Bearing Corp. of Horsham, Pa. (catalog No. XW3). The bearing was located in grooves at the center of two 6 inch diameter ¾ inch thick aluminum plates. Each plate is connected in its center to a 1 inch aluminum spindle 6 inches long. Near the periphery of one aluminum plate, on the side with the attached spindle, 8 round holes ¾ inches in diameter were equally placed around the plate approximately 0.07 inches from the outer edge. A second plate was made the same way but with 9 round holes. Each hole is sized to hold a 0.75 inch diameter, 0.50 inch thick neodymium boron magnet that was hammered in and set with glue (the first plate had magnets with south pole out, and the second plate had magnets with north pole out). The magnets were obtained from All Magnetics, Inc. (Anaheim Calif.). The face plates are placed with their flat sides together and spindles out, with the bearing assembly sandwiched between them.

A Briggs & Stratton permanent magnet (48 volt 150 amp DC) motor was coupled to each shaft end. A 0 to 48 volt power supply energized one motor and different resistive loads (long extension cords with shorts at the end) were connected to the output of the other motor. Current and voltages at each motor were monitored and each shaft speed were measured. By varying the input power to the drive (upstream) motor, a discontinuous relationship with output power was demonstrated. In one experiment two torque conversion ratios were obtained over a wide range of driving voltage only when heavily loaded. At up to eight volts of drive voltage, the output voltage (rpm) increased at a linear rate. Above 8 volts a different and second linear relationship was established with a different torque transfer ratio. This dual gearing mechanism was not seen at low loading ratios and indicates an automated transmission that can be adjusted by adjustment of magnetic fields.

EXAMPLE 3

In this axial connector example, two permanent magnets were placed at close mutual proximity but on opposite faces of two flat flanges that are connected through a ball bearing.

The bearing is a 1.875 inch outer outer diameter 1.275 inch bore needle bearing assembly with a 0.075 inch thick needle bearing. The bearing was located in grooves at the center of two 3.75 inch diameter ½ inch thick aluminum plates. Each plate is connected in its center to a 1 inch aluminum spindle 6 inches long. Near the periphery of each aluminum plate and opposite each other, 2 round holes 0.5 inches in diameter were placed with their outer edges approximately 0.05 inches from the outer edge of the aluminum plate. Neodynium magnets 0.5 inches diameter and 1 inch long were placed into each hole with their surfaces flush with the flange surface opposite the attached spindle. The face plates were placed with their flat sides together and spindles out, with the bearing assembly sandwiched between them. A third plate with axle is prepared with ¾ inch diameter magnets and replaces one of the plates, for increased torque transfer. Four electromagnets are made and fixedly positioned close to the backside (away from the bearing side) of one of the plates. Upon energizing the force holding the plates together is weakened.

This connector demonstrates coupling between the two shafts. Upon exceeding the coupling strength, the two shafts rotate. Coupling strength can be decreased by at least 20%, 50%, 75%, 90% or more by application of an electromagnetic field. Application of such field acts to uncouple a propeller, attached at one shaft, from a motor, that is indirectly coupled to the second shaft.

Transducer Placement and Use

Transducers (both transmitters and receivers, as well as combination devices) may be placed in a wide variety of locations and in a wide variety of combinations for embodiments such as saw blades and watercraft propellers. FIGS. 12 to 16 illustrate representative locations for ultrasonic transducers in a watercraft and are discussed next. Although the use of ultrasonic sensors with watercraft are exemplified, Infrared transducers particularly are useful for small distance sensing such as for detecting fingers and hands near saw blades-during cutting and a skilled artisan readily will appreciate the use and positioning of infrared sensors, particularly in air.

Figure 16:
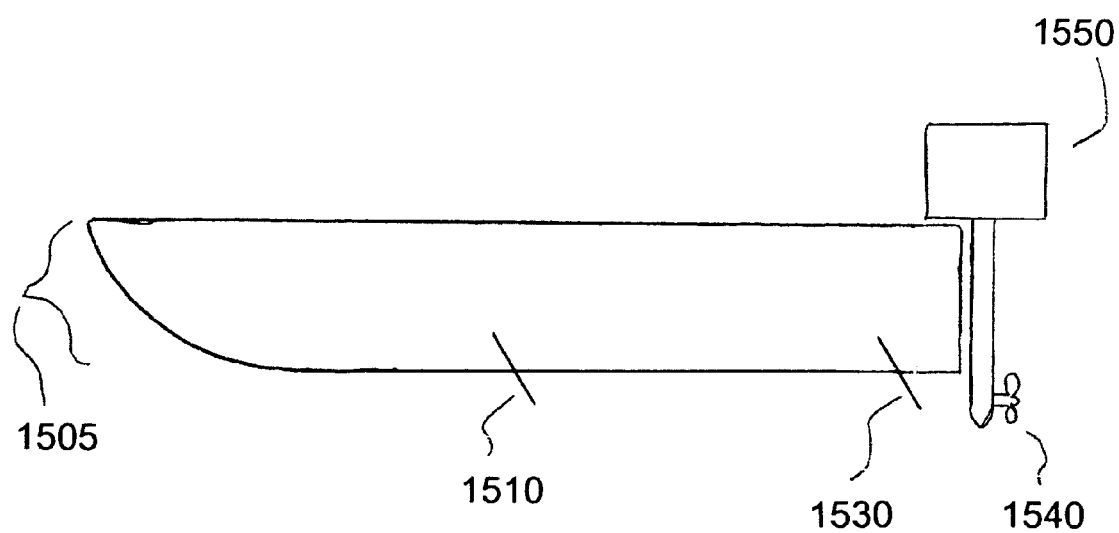
FIG. 16 shows a representative tactile sensor placement in accordance with an embodiment of the invention.

Tactile feeler sensors also may be used and can be placed in a wide variety of locations. FIG. 16 shows one representative arrangement of four sensors on boat hull 1505, two of which are seen in this side view. Sensor 1510 is located on the left side and near the deepest part of the 21 foot long hull and extends 3 inches vertically below the lowest point of the hull. Another sensor (not shown) is on the other side of the hull. Sensor 1530 is near propeller 1540 of outboard motor 1550, having a tip that is 10 inches away from the propeller. In some embodiments a tactile sensor such as one near the propeller has a flat surface (fin shape) that aligns with the water flow and may resemble a movable fin.

In a desirable embodiment not shown, one or more infrared sensors are arranged near a saw blade, knife or other dangerous device that is attached to a motor. The motor optionally is controlled by an electromagnetic device as described herein. A signal, such as an increase in infrared signal or sudden appearance of an infrared signature triggers a stop signal.

In yet another embodiment the sensor is a piezoelectric device that is attached to, for example, a fin or even the hull itself (on the outer surface, or on the inner surface, if stiff enough to transmit vibration such as aluminum or fiberglass). The piezoelectric device monitors possible solid object collisions, which produce detectable vibrations. In an embodiment sharp short time duration vibration collision(s) with one or more sharp protuberances of a hard object (rock) is distinguished from a longer time duration vibration collision with a muddy or sandy bottom via signal filtering hardware or by software analysis of the information.

FIGS. 13a, 13b, 13c, and 14c show related embodiments where sensors are positioned above and below a propeller axis. FIGS. 14a and 14b also show optional sensors 1402 and 1403 that are positioned above the axis and which monitor the port and starboard positions, respectively, of a danger zone. In an embodiment the sensors are angled up from the horizontal to take in most or all of the extended danger zone. The optional two sensor system shown in FIG. 14a and FIG. 14b uses sensors 1402 and 1403, which are tilted up, but not 1401 and can detect solid objects that fall into the water immediately in front of the propeller. In this context sensors 1402 and 1403 are able to detect an object above their axis, and in some cases as is shown here are angled up for better detection in that area.

Figure 14C:
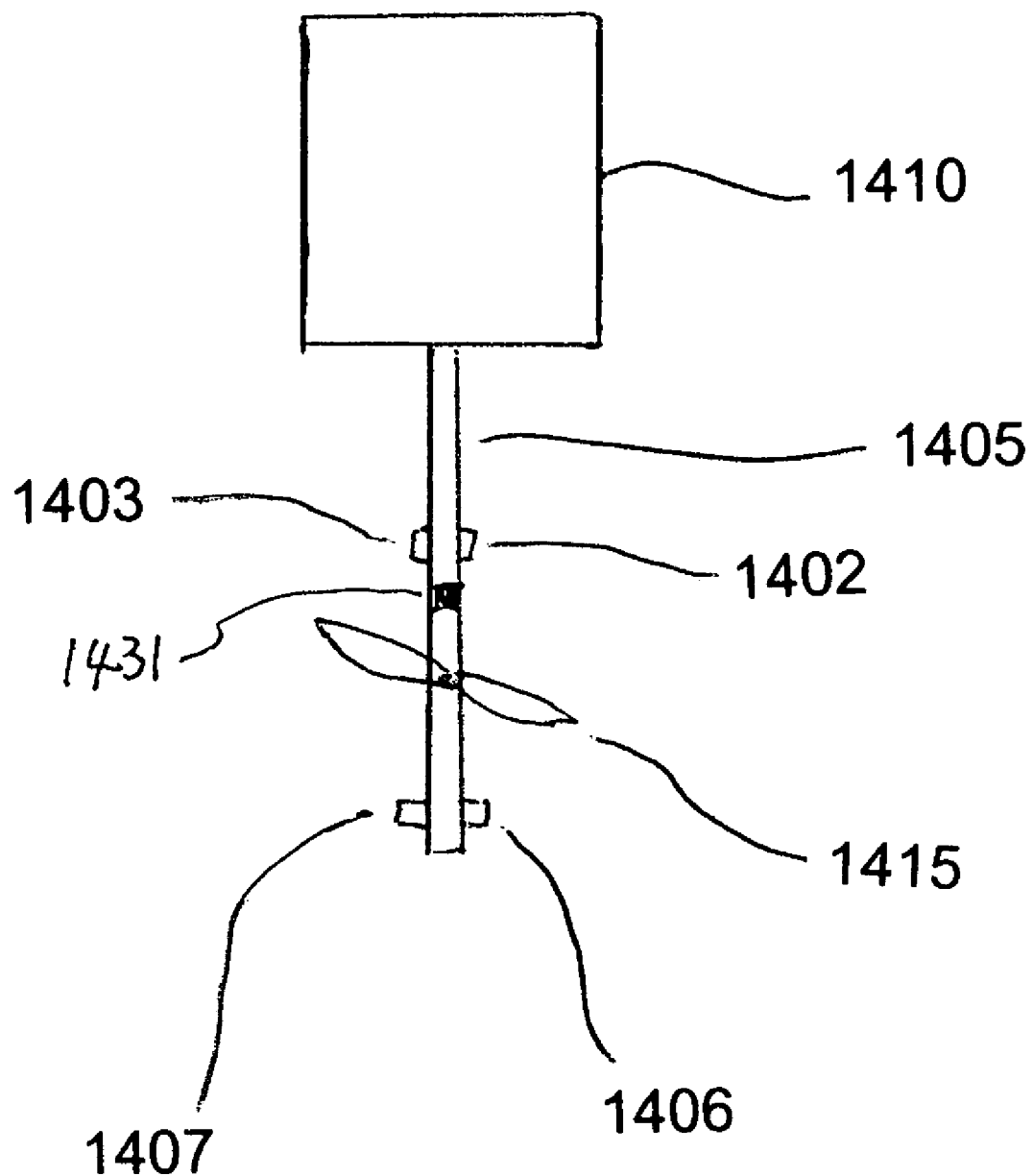
FIG. 14c shows another view of sensors on an outboard electric motor.

FIG. 14c also shows rear-ward facing sensor 1431 that monitors part of or all of a danger zone to the rear of propeller 415. In one embodiment sensor 1431 is tilted up at an angle to monitor at least part of a rear danger zone. Other embodiments of rear-ward facing sensors can be prepared by placing appropriate sensors at other locations of this and other control surfaces and are specifically contemplated.

In some embodiments separate danger zones are sensed both above and below, and to both sides of the propeller axis. Accordingly, it is preferred to use either a single sensor that monitors a wide area, such as sensor 1401 in FIGS. 14a and 14b, or, more preferably multiple sensors. In one embodiment of the invention a first sensor is positioned on the left side of a control surface in the middle of a slip stream and monitors at least the left half of the zone. A second sensor positioned on the right side of the control surface monitors at least the right half of the zone.

Figure 15A:
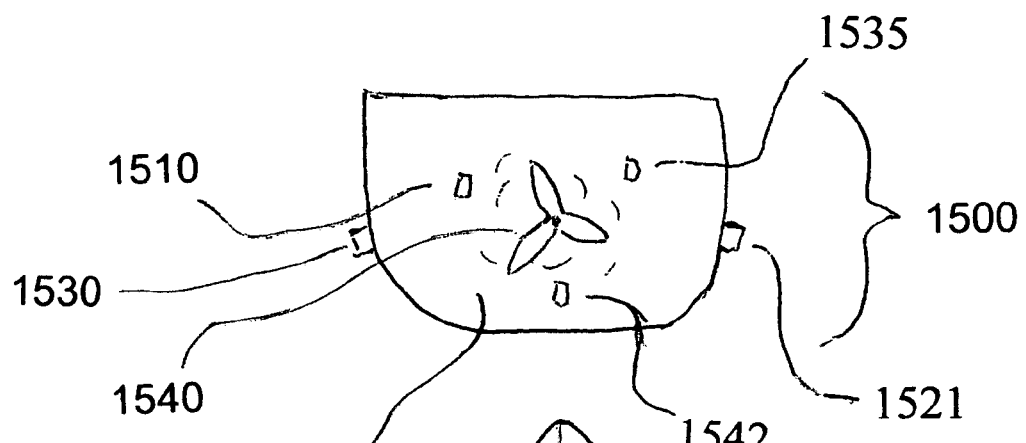
FIG. 15a shows a rear hull view of a three sensor system on a boat hull for detecting imminent propeller contact.

In another embodiment 3 sensors are used, with one monitoring the left side or lower left side, one the right side or lower right side, and one monitoring the top of the danger zone. A three sensor system may, for example, utilize control surfaces as shown in FIG. 13b and FIG. 15a. Sensors 1401, 1402 and 1403 of the system shown in FIGS. 14a to 14c also may be used together in a 3 sensor system. FIG. 13c shows a representative embodiment with four sensors. In some embodiments such sensors may be used to detect the presence of objects to the rear of the propeller. These are particularly important to prevent contact with swimmers who may be behind or at a propeller when the propeller is first turned on, or when the boat motor is switched into reverse. In other embodiments, 5, 6, 7, 8, 9, 10 or more sensors are used and constantly monitor for a signal. A skilled artisan readily will appreciate how to select and position sensors, such as ultrasonic sensor, electromagnetic (e.g. microwave) and infrared sensors, with different pickup patterns to obtain (preferably) overlapping sense volumes.

In a propeller embodiment, to save money and help provide an economical product that would be acceptable (not too costly) to the marketplace, the lower portion of the danger field may be ignored, as such sensing is still better than none. However, in the non-tactile sensor embodiment, full sensing at least somewhere in the danger zone area within two propeller diameters upstream of the propeller is greatly desired. In a preferred embodiment the monitored danger zone is close to the propeller, and may be within 0 and 1 propeller diameters upstream or downstream of the propeller to more accurately detect all object that will come into contact. In another embodiment the minimum circular area that is constantly monitored is at least 1.5 times the diameter of the propeller and in another embodiment the minimum area being monitored has a diameter that exceeds twice the propeller diameter. These latter cases provide a greater margin of safety. Other geometries can be devised by an engineer and are not presented here for the sake of brevity.

When mounting one or more sensors on the boat hull, preferably one or more piezo transmitters are positioned at the sides of the boat at an angle facing rearwards so as to cover most or substantially all of one or more danger zones. A single sensor may be used at the center line. Preferably, however, sensor(s) located on the hull bottom are used together with one or more at the sides to cover shallow regions of a particular danger zone. In another embodiment the extended danger zone above the propeller is monitored to detect things falling into the water there. In another embodiment tactile sensor(s) are added immediately upstream (within 1, 2, 3, 5, 10 propeller diameter distance from the propeller.)

One or more receivers may be positioned near the transmitters or a single sensing unit (transmitter and receiver) may be combined into a single piezoelectric device as is customarily used for fish finders, for both transmission and detection of sonic energy. In an embodiment, a receiver and transmitter are incorporated into the same device, such as a thin film that may be mounted on a hull. The doppler effect may be used for sensing and a more simple detection of minimum reflected energy measurement can be used. Of course skilled workers have a large range of techniques in this field to implement the sensing. Wires from the piezo devices (if used) preferably pass through the hull behind or near the sensor devices. In a preferred embodiment a high Q high impedance piezo electric sensor is used with a field effect transister amplification stage at or in the sensor. This serves to convert a high impedance low current signal into a lower impedance signal prior to transmittal over electric wires, and makes the system less sensitive to electrical noise.

The system may be turned off while maneuvering next to a dock and the system's sensitivity may be electronically adjusted to sense minimum sized objects to prevent energizing upon detection of small debris or bubbles within the water. This system also may be integrated into a sonar for detection of solid objects such as fish, bottom structures, other boats and the shore. A skilled electronics artisan will appreciate how to prepare and/or adjust circuitry and/or software to detect particular types of objects. For example, a system that recognizes a rope is useful for avoiding entanglement with lobster traps and the like. In particular, a boat collision system is contemplated that would both alert the user of an impending possible collision and turn off power to a motor, change direction of thrust (switch into reverse for example) or exert some other collision avoidance behavior.

In most cases a sensor is mounted on a control surface, which is a solid surface of the boat or an attached component such as an outboard motor fairing, rudder or fin that contacts the water upstream of the propeller(s) and experiences water flow during forward boat motion. A control surface may influence boat movement. The hull of a boat is a control surface. Preferably a hull surface close to the propeller is used to mount a sensor, as shown in FIGS. 13a through 16. A fin, rudder or other surface that participates in boat attitude stability, boat direction, speed and so forth also is a control surface. Figures depict rudder or stabilizer fins, as might be found in a submarine or inboard motor powered boat. The control surfaces of FIGS. 14a to 14c may be part of an outboard motor such as the type commercialized by Ray Electric Outboards Inc., or Ecycle.

Many propellers have one or more control surfaces immediately upsteam of the slip stream to take advantage of the high flow rate of water found immediately in front of the propeller to control boat movement. Likewise, a swimmer's body is at great risk in this area because of the high water flow and the risk of being pulled into that same slip stream. In this context, preferred embodiments of the invention may be thought of as adding intelligence to these control surfaces.

Placing sensors as described herein immediately upstream to the propeller (in the slip stream) on control surfaces provides other advantages relating to boat intelligence as well. Such sensing can report the state of flow of water over those surfaces. That is, the sense signal(s) can be used to output a propulsion status indication, boat speed indication (by virtue of monitoring reflectance from, for examples bubbles that pass between adjacent sensors), cavitation, presence of weeds, water turbidity, relative efficiency of movement useful for controlling optimum motor power, and the like. For example, weeds and turbidity can be detected with correct selection of sonic measurements and/or with infrared detection.

Movable tactile feeler(s) such as a rod, wire or fin may be used that have a sensor to create a continuously variable electrical signal corresponding to pressure on the sensor. Preferably such sensors ar further utilized to obtain more information beyond predicting collision with a propeller. A tactile sensor may be arranged that outputs a signal that changes with boat speed. As the boat moves faster, more deflection of the tactile sensor exists and (typically) a greater deviation signal is generated, indicating higher speed. Such sensors thus can be used to detect speed as well as collisions.

Most propellers are used in a reversed direction at times to make a watercraft travel backwards. This motion is especially dangerous to swimmers located to the rear of the propeller and in preferred embodiments one or more sensors are directed to sense a danger zone to the rear of the propeller to alleviate this problem.

Rapid Stopping of an Internal Combustion Engine Driven Propeller

In a preferred embodiment for fossil fuel powered internal combustion engines the activator interrupts high voltage pulses to the spark plugs and also engages a friction device to absorb kinetic energy of the motor and its shaft. A large variety of means for stopping voltage to the spark plug is easily determined by a skilled artisan. The friction device preferably is attached to the motor crank shaft and/or shaft.

A preferred friction device is a disc or other solid surface attached to the shaft and upon which a disc brake caliper or shoe applies force, slowing the rotation. A variety of braking devices are known. "Bendix" has commercialized a number of such brakes and clutches over the years that may be used or modified for this embodiment of the invention.

Magnetic braking also may be used to rapidly stop a shaft as described above. In one embodiment a permanent magnet is mounted to the shaft and rotates within a surrounding electromagnet. When a braking is desired, an electric current is applied to the electromagnet in a polarity such that the individual electromagnetic field(s) oppose the permanent magnetic field(s). This electromagnetic/permanent magnet system also may be used as a starter motor for the internal combustion engine and as an electricity generator. In another embodiment both the moving magnetic field(s) and the fixed field(s) are made from electromagnets.

Multiple Users via Multiplex Systems

An important feature of an embodiment is continuous sensing of one or more danger zones through constant emission of signals, either sonic, galvanometric, infrared, microwaves, or other. When two or more boats come close to each other signal(s) from one boat may be sensed by another. If the interfering signal is similar (eg, in frequency, pulse coding etc) to the expected signal then the interfering signal may trigger an improper propeller turn off. In some situations, such as during collision avoidance maneuvering this turn off can lead to undesirable loss of control. This embodiment of the invention provides systems for removing or alleviating the effects of such cross talk.

According to embodiments of the invention a propeller shut off system automatically senses the presence of the coded sensor of another boat and shifts frequency or pulse form in response. According to this embodiment, after the propeller automatically is shut off in response to sensing an intrusion into a danger zone, the signal generator, (such as piezoelectric transmitter, galvanometric current, infrared radiation, microwave or other electromagnetic radiation etc) is switched off and the danger zone monitored. If the danger zone intrusion signal remains then the system switches into multiplex mode. In multiplex mode the system alters to the use of a different frequency or other signal characteristic, which at least potentially avoids the other signal system. This alteration (turning off the danger probe signal, monitoring for loss of sensed signal, and moving sensor system to a new frequency or pulse characteristic if needed) preferably occurs rapidly, preferably less than 0.5 seconds and more preferably in less than 0.1, 0.1, 0.05 and even less than 0.025 seconds. Because of the short time period required for this operation, in most instances one boat will move its sensor characteristics (such as frequency) before the other danger zone intrusion system is activated.

EXAMPLES OF USE FOR PROPELLER GUARDS

The sensor circuit(s) are applicable to a wide range of control surfaces.

In these examples the term "sensor" means a piezoelectric device in the context of positioning on a boat hull or other control surface. The term sensor also is used in a general sense to include associated circuitry (not located on the hull in these examples) that output a signal (or trigger a control portion of a common circuit).

Example 1

Acoustic sensor 1220 is mounted on the port side of boat fuselage 1200 as shown in FIG. 12a. The sensor comprises a flat quartz crystal and a drive/monitoring circuit (located inside the boat) and is adjusted to provide a signal when a submerged solid object presenting more than 1 square inch cross sectional area is placed 15 inches directly in front. Another piezoelectric from a second sensor is mounted on the opposite starboard side of fuselage 1200. The faces (plane of the vibrating piezoelectric crystal) of the sensors are pointed forwards away from the propeller at a 10 degree angle away (toward the starboard and port sides respectively) from the central axis of the boat such that each sensor monitors the water on each respective side of fuselage in front of the propeller.

The signals from the two sensors trigger an activator. The activator may brake an internal combustion engine or may control one or more electromagnets such as the power to the armature of a permanent magnet electric motor by a control circuit that uses pulse width modulation. The activator in this case may include a voltage sensor (input resistance) that accepts a voltage output from the sensor circuit when a threshold signal indicate a minimum sized object in the danger zone. When either sensor detects the solid object and causes a signal output, the activator reverses the power output from the controller control circuit until the back electromotive force induced in the control circuit from the kinetic energy of the slowing motor reaches a minimum threshold value (indicating a low or no speed condition).

In a variation of this example, two sensors 1330 and 1340 are positioned at the top and bottom of a control surface fin as in FIG. 13a. In yet another embodiment additional sensors 1354 and 1352 are used in combination with sensors 1351 and 1353. Here, all four sensors are pointed directly to the front. A transmitter may be used to continuously emit a signal in front of the sensors, and in a less desirable embodiment the same sensors both emit and receive ultrasonic energy.

In a desirable variation, rather than using the a single sensor to monitor a given area in a pulse generation and detection mode (such as used for fish finders) one piezoelectric device is used as a transmitter and another is used as a receiver, to allow greater short range sensitivity and greater immunity from false signals. In this case pairs of sensors may be are used (one on top and one on the bottom) to generate a signal at one sensor and receive at the other. If a solid body enters the space near the sensor, that body will reflect sonic energy to the receiver. A threshold detecting circuit then outputs a signal when the reflected energy exceeds a given set value. Most desirably a single transmitter is used in the middle, or two transmitters are used, one on each side.

Example 2

In this example galvinometric measurements are made using electrodes distributed on two fin surfaces in a pattern such as shown in FIG. 13a and FIG. 13c. The measurements are input into a comparator that monitors and adjusts for long term (more than 5 seconds) changes in conductivity. When a solid object enters the volume between the upper and lower electrodes, galvinometric measurements indicate a short term change in conductivity and output a signal to a control circuit, stopping the propeller. In further embodiments conductivity between pairs of facing electrodes is used to detect an approaching body, which perturbs conductivity between the left most electrodes before doing so to pairs of electrodes to the right. A multihull watercraft may employ galvanometic sensing by the use of sensors on different hulls in contact with the water in front of a propeller.

Example 3

Figure 15B:
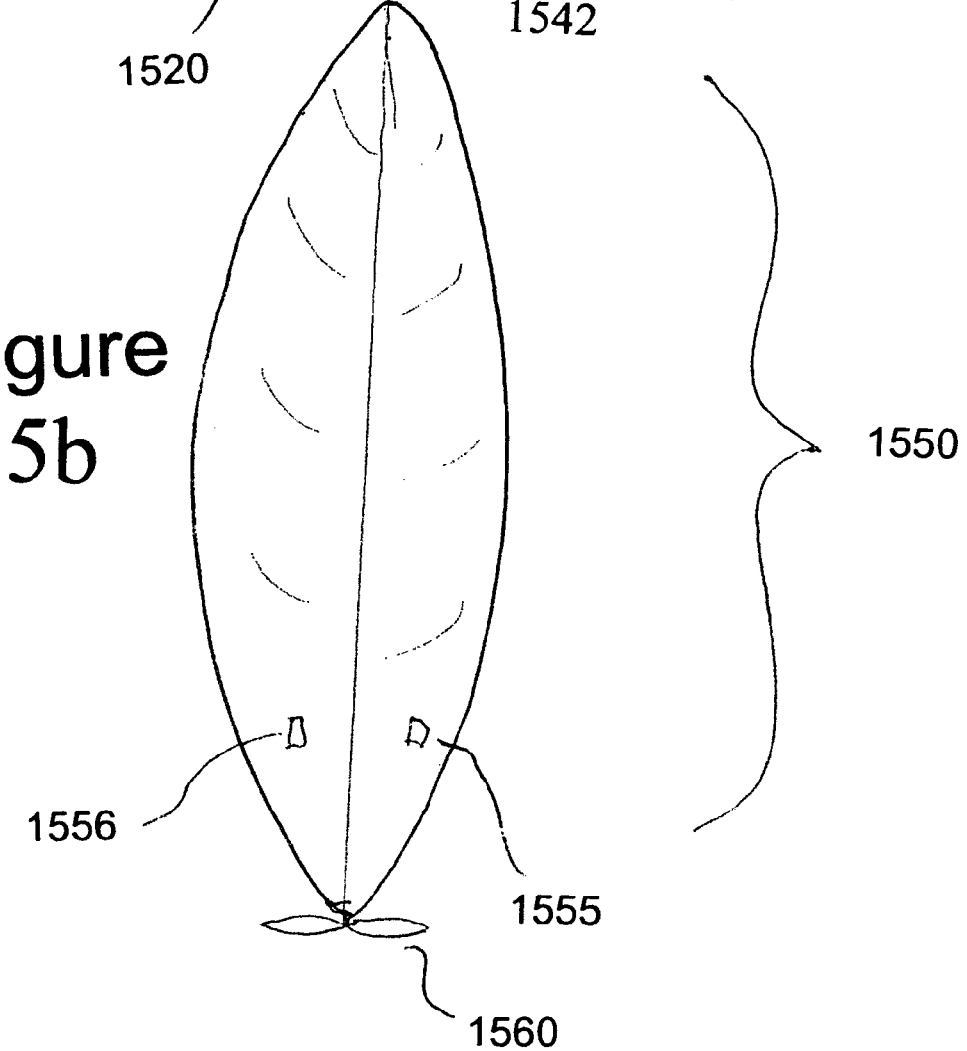
FIG. 15b shows a bottom hull view of a two sensor system on a boat hull for detecting imminent propeller contact.

In this example, boat hull 1550 of FIG. 15b (bottom view) has an attached propeller 1560 and a outside-rear facing piezoelectric sensor 1556. A second sensor 1555 that also faces outside (away from the boat) and towards the rear is mounted on the opposite side from sensor 1560. Both sensors (including their signal analysis circuitry) monitor for intrusion of a solid body and are adjusted to ignore signals from the propeller. In one case, one sensor acts as a transmitter to the other. For example, sensor 1555 emits a sonic signal while sensor 1560 monitors for a reflection of that signal by a solid object. In an embodiment, the two sensors alternate transmission to the other, and obtain more information about the size and/or movement of a detected solid object that way.

A number of algorithms may be used to extract more information and to improve signal to noise with respect to the propeller. In one such algorithm, a signal obtained from sensor 1555 upon transmission by sensor 1560 is compared with a signal obtained from sensor 1560 upon transmission by sensor 1555. By comparing the signals, an interfering propeller signal is minimized. In another embodiment, a third dedicated piezoelectric transmitter is positioned equidistantly between the sensors 1555 and 1560 on the hull under the waterline and background signals from the two receivers 1555 and 1560 are compared to subtract common signals such as a propeller signal. In yet another embodiment one, two or more transmitters are located just upstream of the propeller and emit signals away from the hull such that an object in the sonic vibration path can reflect energy to one or both sensors. Upon detection of a solid body, the motor/propeller control circuit causes the propeller to stop suddenly.

In a variation shown in FIG. 15*a*, boat hull 1500 has an attached propeller 1540 and three outside-rear facing piezoelectric sensors. Sensor 1542 is located at the bottom of the hull and sensor 1510 is located two thirds the way up the hull on the port side. A third sensor 1535 is located two thirds the way up the hull on the starboard side. The three sensors have overlapping fields of detection. In this example each piezoelectric sensor optionally uses a separate frequency and can locate a solid body independently.

In another embodiment related to this, four sensors facing out and to the rear are used on a hull such as shown as hull 1500 in FIG. 15*a*. One transmitting sensor is at the bottom at the location of sensor 1542. A second transmitting sensor optionally is at the center top of the hull below the waterline (not shown). Equidistant from the sensor at location 1542 and about half way up the hull on the port side is receiving sensor 1530 and another sensor 1521 on the other side. During operation the transmitting sensor(s) emit 200 Khz sonic vibrations. The side-mounted sensors receive some sonic energy reflected off of the propeller blades and this reflected signal is filtered out by a filtering circuit. When a solid object enters a danger zone, (which is defined for purposes of illustration as half way from the sensors to the propeller) the reflected signal(s) are generated and received by at least one of the side receivers, and an output signal is sent to a control circuit that rapidly stops the propeller.

In another embodiment 6 sensors are equally spaced in a ring in like manner about the axis of a hull with alternating transmitting and receiving piezoelectric transmitters and receivers. The extra sensors improves the coverage available. In yet another embodiment the sensors as described in this example are mounted 6 inches to the front of the propeller at separate locations (top and bottom, side etc) as before, but facing out and forward, away from the propeller.

Figure 12:
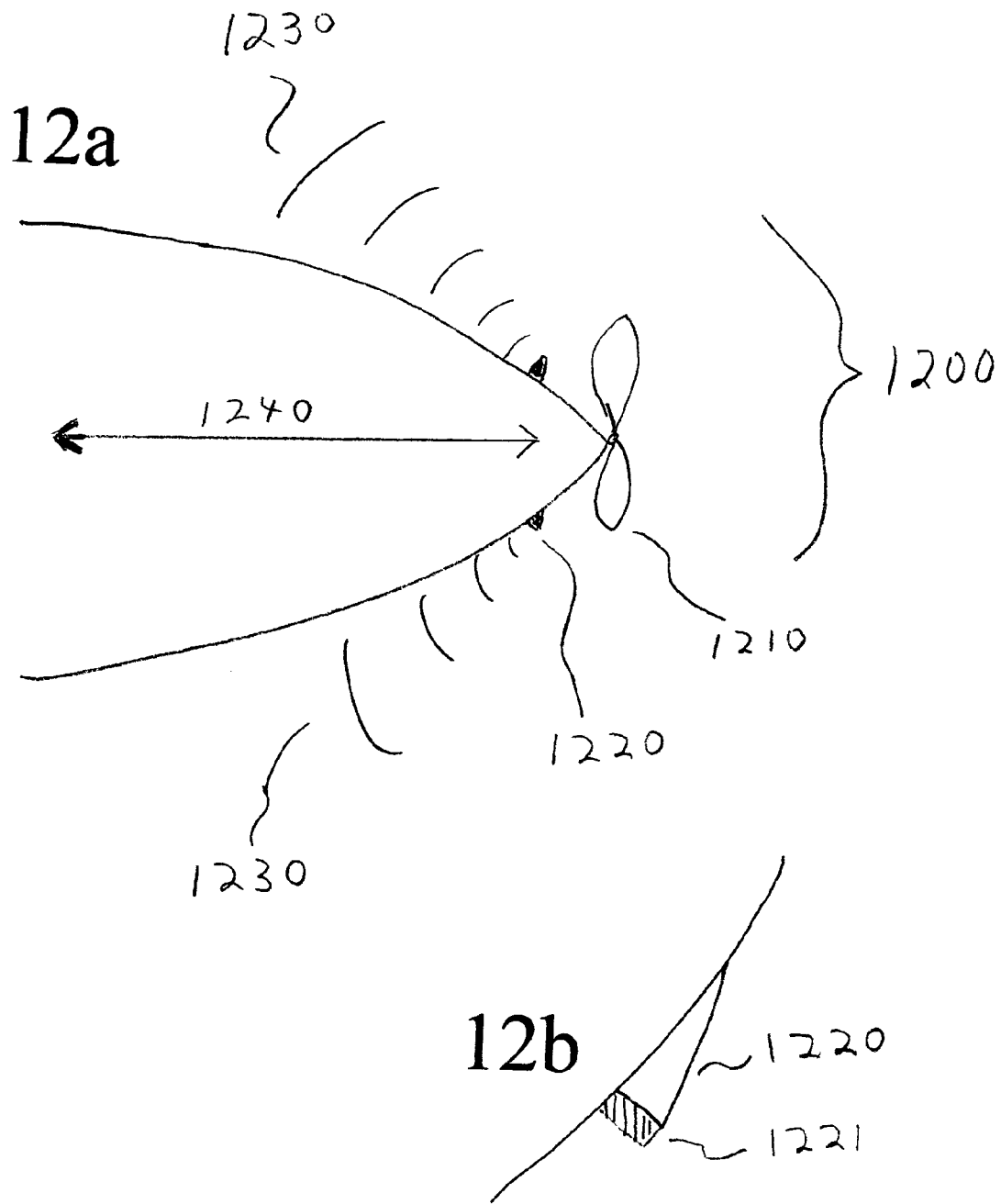
Figure 13:
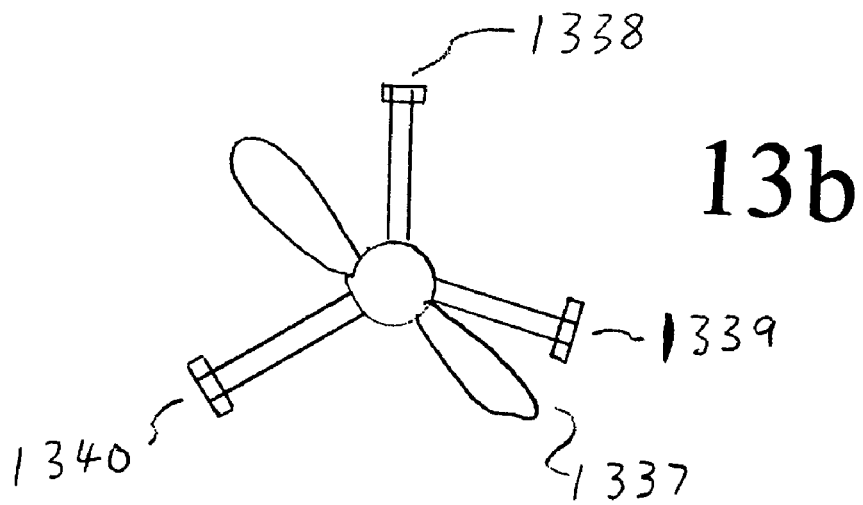
FIG. 13a is a rear view of a two sensor system (on two control surfaces) for detecting imminent propeller contact with a solid body.
FIG. 13b is a rear view for a three sensor system (on three control surfaces) for detecting imminent propeller contact with a solid body.
FIG. 13c is a rear view for a four sensor system for detecting imminent propeller contact with a solid body.
Figure 13:
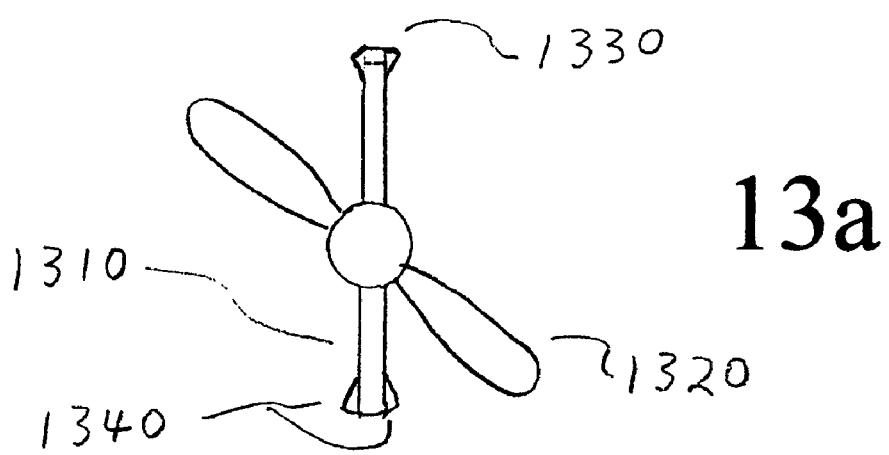
Figure 13:
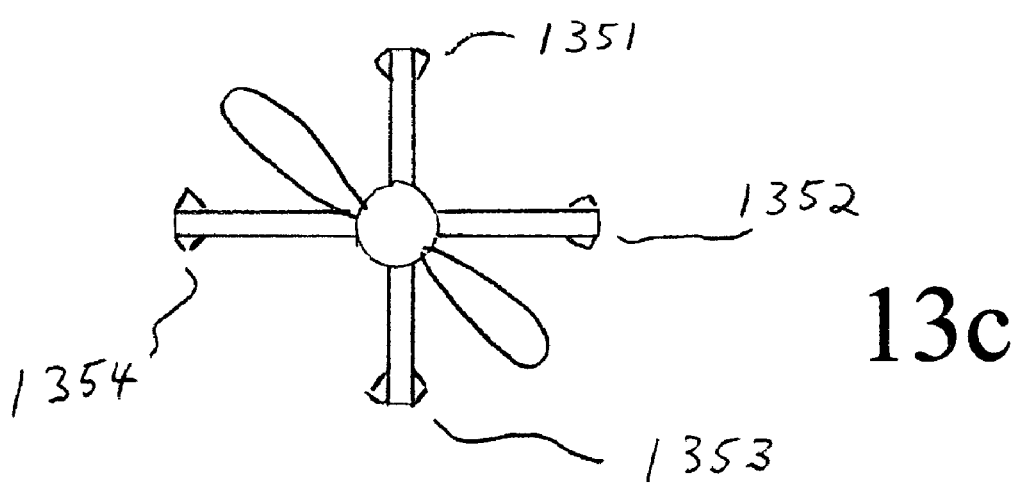

Preferably the sensors are pointing between 5 degrees and 60 degrees away from the long axis of the boat, and more preferably between 15 degrees and 45 degrees. FIG. 12 (a bottom view) depicts this embodiment. Boat hull 1200 has attached propeller 1210. Sensors 1220 and 1230 are shown at the starboard and port sides of the hull, respectively, for convenience. Sonic waves 1230 are emitted from the sensors, which also detect reflective signals. In another embodiment not depicted here, additional sensors located next to (within 10 centimeters from) sensors 1220 and 1230 continuously detect reflections while sensors 1220 and 1230 continuously transmit sonic vibrations forward of the propeller. Sensor 1220 has face 1221 that points away from propeller 1210 as shown in FIG. 12*b*. The plane of 1221 is partly perpendicular to boat axis 1240. The angle between vector 1240 and face 1221 (FIG. 2*a*) preferably is between 15 and 45 degrees. In other embodiments sensors have similar respective faces that may point toward the propeller at the rear, and preferably make an angle between 15 and 45 degrees with respect to the boat axis vector.

When using rear directed sensors, it is important to space the sensors further away from the propeller, such as between 25 and 75, 10 and 25, and or between 1 and 10 propeller diameters from the propeller towards the front of the boat. It is important in these cases generally to correct for signals produced from the propeller, as the propeller will generate a reflected signal. In one embodiment a propeller speed signal (preferably measured from a tachometer) is input to a correction circuit that will help correct for the propeller signal. The background propeller signal in most instances will change with propeller speed. By monitoring the speed, better background signal correction can be used.

Example 4

This example illustrates detection of a solid object using sensors attached to one or more fins immediately in front of the propeller.

FIG. 13*a* shows single axis fin 1310 in front of propeller 1320. Sensors 1330 and 1340 are mounted to the tops and bottom of fin 1310 four inches in front of propeller 1320 and face forward. These sensors are piezoelectric and detect solid objects in a manner as described in Example 3. FIG. 13*b* shows a three axis fin in front of propeller 1337 with sensors 1338, 1339 and 1340 at the tips of the fins facing directly forward. In this example, the fins have the greatest size at the very rear near the propeller (not shown). Thus, the sensors have clear space in front to send and/or to receive sonic vibrations to detect intruding solid objects. The individual sensors can be independent (the same piezoelectric device is both a transmitter and receiver) or may be coordinated with each other by sending signal(s) between them. In embodiment, one or more additional transmitting only sensors are included on one or more fins or other control surface(s). Upon sensing intrusion of a solid body via reflected sonic energy (echo) from the intruding body surface, a sensor or sensor combination triggers a control circuit to quickly stop the propeller.

FIG. 13*c* shows placement of four sensors 1351, 1352, 1353 and 1354 at the upstream sides of four fin tips. These sensors work in like manner to that explained for the sensors of FIG. 13*b*.

Example 5

In this example sensor 1401 is mounted at the leading edge of vertical post 1405 of electric outboard motor 1410 shown in FIG. 14*a*. During operation the sensor scans the water ahead of the propeller and (via its circuitry) is adjusted to create a propeller immediate stop signal when detecting a new solid object having 2 square inches of cross sectional area perpendicular to the sonic emissions of the sensor within 20, 10, 5, 2 or less feet of that sensor. The sensor can be adjusted to additionally detect solid object intrusion into the extended danger zone represented as plane 1421 in FIG. 14*b*. Plane 1421 extends in a vertical axis from the water surface on the right side of 1421 down to the top of the propeller and is as wide as two propeller widths. (Sensors 1402 and 1403, also shown in this figure are optional and are not used in this example.)

Example 6

In this example sensors 1406, 1407, 1402, and 1403 are attached to vertical post 1405 of electric outboard motor 1410 shown in FIG. 14c. The sensors are mounted on the bow side of post 1405 in front of propeller 1415. Sensors 1402 and 1406 are pointed slightly to the left as facing forwards, (preferably 5 to 45 degrees to the left of the boat long axis). Sensors 403 and 407 are pointed slightly to the right as facing forwards, (preferably 5 to 45 degrees to the right of the boat long axis). During operation, the sensors scan the water ahead of the propeller and are adjusted to create a propeller immediate stop signal when detecting a new solid object within 10 feet, 5 feet, or 2 feet of a sensor. In an embodiment, one or more transmitters located on post 1405 continuously transmit sonic energy straight ahead and the sensors continuously monitor for reflected signals.

Example 7

In this example 2 rear-ward facing sonic sensors 1556 and 1555 are mounted equally spaced from the center line of a 21 foot long boat hull and half way up the water line, and face propeller 1560 (FIG. 15b, a bottom view). The sensors detect a body that enters the water near the propeller and activate an immediate propeller brake sequence upon detecting a solid object that enters the danger zone 2 feet in front of the propeller. In another example the sensors are further away (4 feet, 10 feet or more) in front of the propeller.

Example 8

In this example sensors 1510, 1535 and 1542 are mounted on hull 1500 3.5 feet in front of propeller 540 as depicted in FIG. 15a (a rear view of a portion of a boat cross section). The propeller in this case has a diameter of 14 inches. Each sensor is facing to the rear. Each sensor is mounted 24 inches away from the rotation axis of the propeller. During use, the sensor signals are corrected for the propeller signal and, after correction is made, a solid object is detected by reflection of sonic vibration as described above.

One embodiment is a correction system for diminishing the propeller signal from the detection signal. This correction system may be implemented in hardware or in software. The system uses at least two and preferably at least 3 separate sensors (as exemplified in FIGS. 15b/15c) that face to the rear and that are generally equally affected by the propeller. By placing each sensor the same distance away from the propeller and matching each sensors characteristics, the sensor outputs are compared to detect a new object entering the danger zone. That is, each sensor will output a similar propeller signal. That strong background signal is automatically negated by comparing each signal with each other. One way to implement this embodiment is to subtract one signal from the other to obtain a difference signal. If the difference is greater than a threshold value then a propeller stop signal is generated.

In practice, this automatic correction system works best when the propeller rotates rapidly. A time constant for each sensor output should take into account the propeller speed and time between each propeller blade comes in front of each sensor. By comparing each sensor output, with compensation for the delay between presentation of propeller blades in front of each detector this system can sensitively detect intrusion of a solid object. In a most preferred embodiment, a three blade propeller is used with a three sensor system where the sensors are equally spaced around the propeller, providing the most even propeller background signal for correction. This embodiment as well as the others may be implemented with a microprocessor executing a stored program.

Other combinations of the inventive features described above, of course easily can be determined by a skilled artisan after having read this specification, and are included in the spirit and scope of the claimed invention. Documents cited herein specifically are incorporated in their entireties by reference.

I claim:

1. An electrical control system for suddenly stopping a propeller in a motor driven watercraft, comprising at least one sensor that detects an object near the propeller and a control circuit that can stop or slow the propeller to less than 10 rpm within one second, wherein the at least one sensor triggers the control circuit upon sensing the object, and the control circuit stops a motor connected to the propeller.

2. An electrical control system as described in claim 1, wherein the at least one sensor is a piezoelectric device.

3. An electrical control system as described in claim 1, comprising at least 2 piezoelectric sensors.

4. An electrical control system as described in claim 1, comprising at least 3 piezoelectric sensors.

5. An electrical control system as described in claim 1, comprising at least one continuously emitting sonic transmitter.

6. An electrical control system for suddenly stopping a propeller in a motor driven watercraft in proximity to an object, comprising at least one sensor, a propeller, a motor connected to the propeller, and a control circuit that can stop or slow the propeller to less than 10 rpm within one second, wherein the sensor triggers the control circuit upon sensing the object.

7. The electrical control system of claim 6, wherein the at least one sensor is a piezoelectric transmitter that transmits ultrasonic energy continuously.

8. The electrical control system of claim 6, wherein the at least one sensor comprises at least two piezoelectric transmitters that emit two frequencies or pulse types simultaneously.

9. The electrical control system of claim 6, wherein the control circuit comprises a capacitor discharge circuit for rapidly pulsing an electromagnet.

10. The electrical control system of claim 6, wherein at least one motor of the motor driven watercraft is an internal combustion motor.

11. The electrical control system of claim 10, wherein the control circuit comprises a capacitor discharge circuit for rapidly energizing an electromagnet.

12. The electrical control system of claim 11, wherein the capacitor discharge circuit comprises a capacitor with a capacity rating of at least 10,000 microfarads and a voltage rating of at least 100 volts.

13. The electrical control system of claim 9, further comprising at least one silicon controlled rectifier, IGPT or MOSFET for discharging the capacitor.

14. The electrical control system of claim 6, further comprising at least one electromagnet and at least one permanent magnet arranged to disengage the propeller from the motor upon activation.

15. The electrical control system of claim 6, further comprising a friction brake for slowing the propeller upon activation.

16. An electrical control system for suddenly stopping a propeller in a motor driven watercraft, comprising at least one propeller that is connected to a motor, at least one sensor selected from the group consisting of an infrared sensor, an ultrasonic sensor and a tactile switch sensor, and a control circuit connected to the sensor that pulses into one or more electromagnets upon activation by the sensor, and wherein the one or more electromagnets act to at least slow or disconnect the propeller from the motor upon activation.

17. The electrical control system of claim 16, wherein the electricity that is pulsed into one or more electromagnets is from one or more capacitors.

18. The electrical control system of claim 17, wherein the capacitor has a rating of at least 10,000 microfarad and at least 100 volts.

19. The electrical control system of claim 17, comprising at least two capacitors that are separately discharged into one or more electromagnets with different time constants upon activation by the control circuit.

20. The electrical control system of claim 16, wherein the sensor comprises at least one piezoelectric transducer.

21. The electrical control system of claim 16, wherein the at least one sensor comprises at least two piezoelectric devices oriented in different directions.

22. The electrical control system of claim 16, wherein the one or more electromagnets are fixed and exert a magnetic field against one or more permanent magnets located on a spinning shaft attached to the propeller.

23. The electrical control system of claim 22, wherein the spinning shaft comprises a first flange with one or more magnets that exert a field upon a second flange that comprises one or more magnets of opposite polarity, wherein the first and two flanges are held together by magnetic attraction but spaced apart via a bearing.

24. The electrical control system of claim 16, wherein the one or more electromagnets are part of an electric motor that drives the propeller.

25. An electrical control system for suddenly stopping a spinning shaft, comprising at least one sensor and a control circuit that comprises a capacitor stored charge of electricity that is pulsed into one or more electromagnets upon activation by the at least one sensor, the at least one sensor comprises at least one infrared sensor or ultrasonic sensor and wherein the one or more electromagnets act to at least slow or disconnect the shaft from a motor upon activation.

26. The electrical control system of claim 25, wherein the spinning shaft is connected to a propeller.

27. The electrical control system of claim 25, wherein the capacitor has a rating of at least 10,000 microfarad and at least 100 volts.

28. The electrical control system of claim 25, comprising at least two capacitors that are separately discharged into one or more electromagnets with different time constants upon activation by the control circuit.

29. The electrical control system of claim 28, wherein a first capacitor discharge circuit has a time constant of less than 100 milliseconds and a second capacitor discharge circuit has a time constant of less than 500 milliseconds.

30. The electrical control system of claim 25, wherein the one or more electromagnets are fixed and exert a magnetic field against one or more permanent magnets located on the spinning shaft.

31. The electrical control system of claim 30, wherein the spinning shaft comprises a first flange with one or more magnets that exert a field upon a second flange that comprises one or more magnets of opposite polarity, and wherein the first and two flanges can rotate together on the same rotational axis by magnetic attraction between them but are spaced apart via a bearing.

* * * * *